(12) United States Patent
Minamida et al.

(10) Patent No.: US 8,978,670 B2
(45) Date of Patent: Mar. 17, 2015

(54) SUBSTRATE PROCESSING APPARATUS

(75) Inventors: Junya Minamida, Kumamoto (JP); Issei Ueda, Kumamoto (JP); Yasuhiro Chouno, Kumamoto (JP); Osamu Kuroda, Kumamoto (JP); Kazuyoshi Eshima, Kumamoto (JP); Masahiro Yoshida, Kumamoto (JP); Satoshi Morita, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 1001 days.

(21) Appl. No.: 12/897,384

(22) Filed: Oct. 4, 2010

(65) Prior Publication Data
US 2011/0079252 A1 Apr. 7, 2011

(30) Foreign Application Priority Data

Oct. 6, 2009 (JP) ................. 2009-232056

(51) Int. Cl.
*B08B 3/00* (2006.01)
*H01L 21/67* (2006.01)

(52) U.S. Cl.
CPC ...... *H01L 21/67051* (2013.01); *H01L 21/6708* (2013.01); *H01L 21/67178* (2013.01); *H01L 21/6719* (2013.01); *H01L 21/67196* (2013.01); Y10S 414/135 (2013.01)
USPC .............. 134/94.1; 134/133; 134/61; 118/52; 118/58; 118/620; 118/500; 118/66; 396/611; 396/572; 396/575; 396/624; 414/935; 414/147

(58) Field of Classification Search
CPC ................... H01L 21/67051; H01L 21/67178; H01L 21/67028; H01L 21/67225; H01L 21/67184
USPC ............... 134/94.1, 133, 61; 118/52, 58, 620, 118/500, 66; 396/611, 572, 575, 624; 414/935, 147

See application file for complete search history.

(56) References Cited

U.S. PATENT DOCUMENTS

2003/0213431 A1* 11/2003 Fukutomi et al. ............. 118/696

FOREIGN PATENT DOCUMENTS

JP 2004-87675 A 3/2004
(Continued)

OTHER PUBLICATIONS

Koyama et al., Substrate treating device Mar. 2004, (Machine Translation).*

(Continued)

*Primary Examiner* — Michael Barr
*Assistant Examiner* — Thomas Bucci
(74) *Attorney, Agent, or Firm* — Abelman, Frayne & Schwab

(57) ABSTRACT

Provided is a substrate processing apparatus wherein, even if a trouble occurs, it is bound to continue a process for the substrate without stopping the substrate processing apparatus entirely. The substrate processing apparatus according to the present disclosure includes first and second substrate conveying devices configured to convey wafers, and first and second processing blocks provided on the right and left sides of the substrate conveying device and having processing unit arrays each configured to perform the same process. Processing unit arrays on one side and processing unit arrays on the other side are respectively connected to a processing liquid supply system commonly provided with them. And, when any one of substrate conveying devices, processing liquid supply systems has a problem, the process for the wafer can be performed in the processing unit array to which the substrate conveying device and the processing liquid supply system under normal operation belong.

6 Claims, 16 Drawing Sheets

(56) References Cited

FOREIGN PATENT DOCUMENTS

| | | |
|---|---|---|
| JP | 2004-087675 A | 3/2004 |
| JP | 2008-34490 A | 2/2008 |
| JP | 2009-117824 A | 5/2009 |
| JP | 2009-135294 A | 6/2009 |

OTHER PUBLICATIONS

Koyama et al., "Substrate treating device", Mar. 2004, JP 2004-87675 (Machine Translation).*

* cited by examiner

FIG. 7

| component having a trouble / unit array to be stopped | liquid processing unit | | | | process arm | | chemical liquid supplying unit | | carry-in/carry-out arm |
|---|---|---|---|---|---|---|---|---|---|
| | U1 | U2 | U3 | U4 | PA1 | PA2 | CU1 | CU2 | |
| U1 | × | ○ | ○ | ○ | × | ○ | × | ○ | × |
| U2 | ○ | × | ○ | ○ | × | ○ | ○ | × | × |
| U3 | ○ | ○ | × | ○ | ○ | × | × | ○ | × |
| U4 | ○ | ○ | ○ | × | ○ | × | ○ | × | × |

(○ continue operating
× Stop)

FIG. 9
(a)
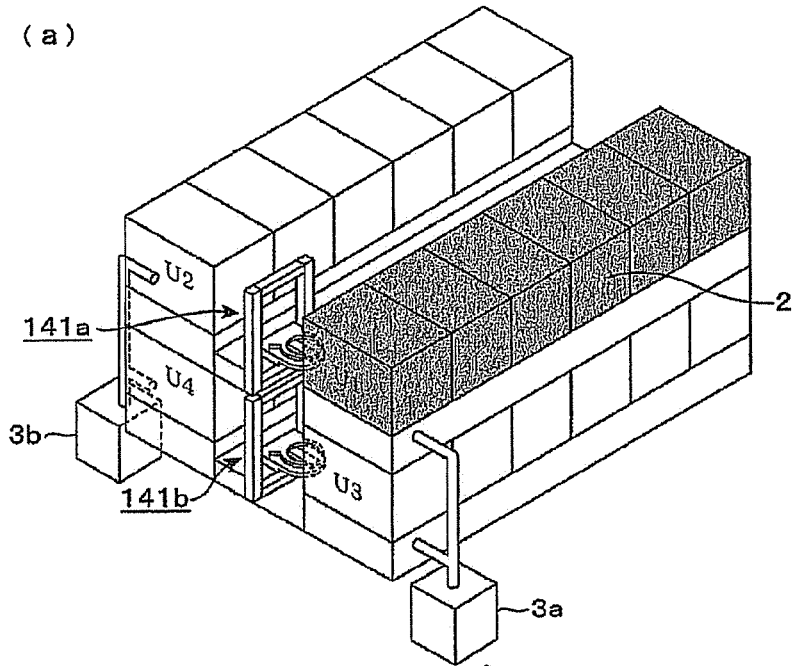
(b)
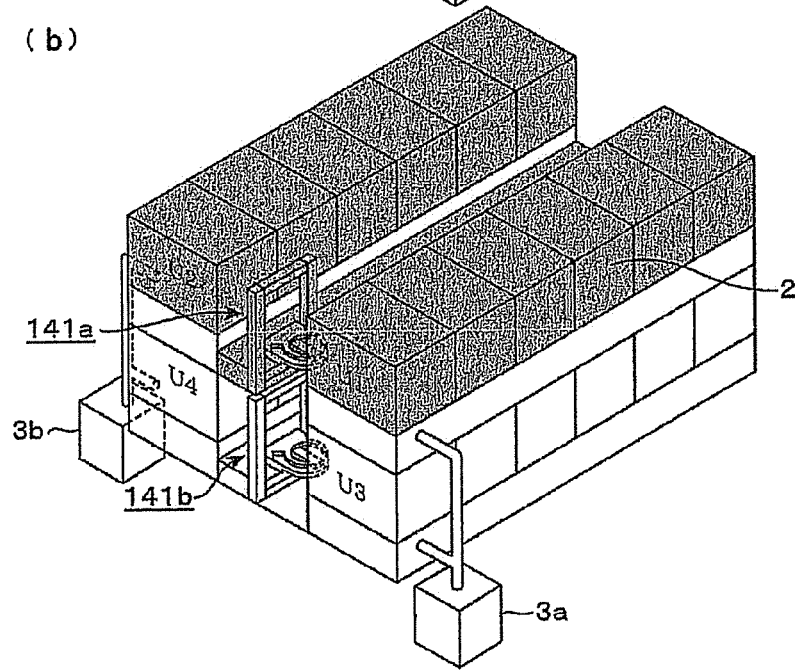

FIG.15
(a)
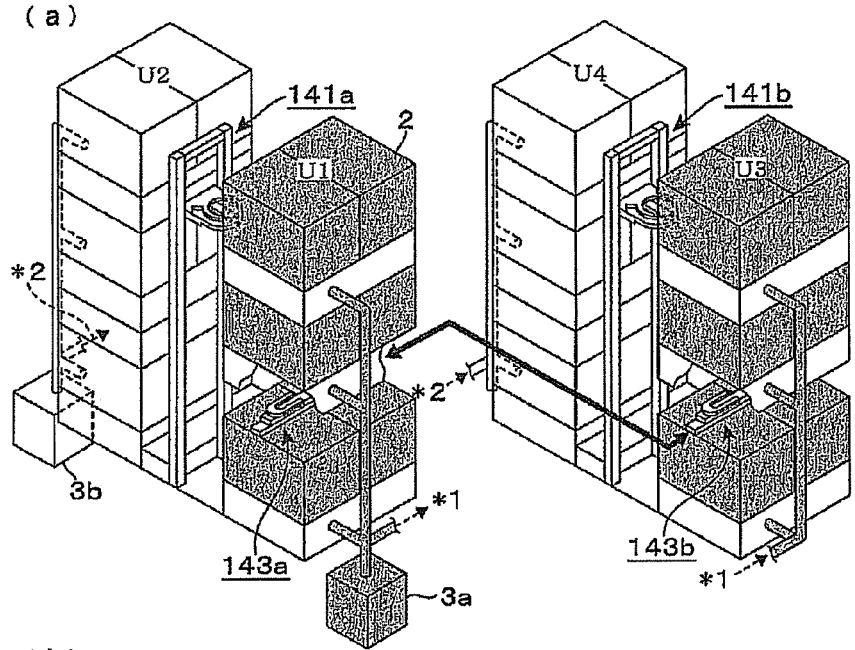
(b)
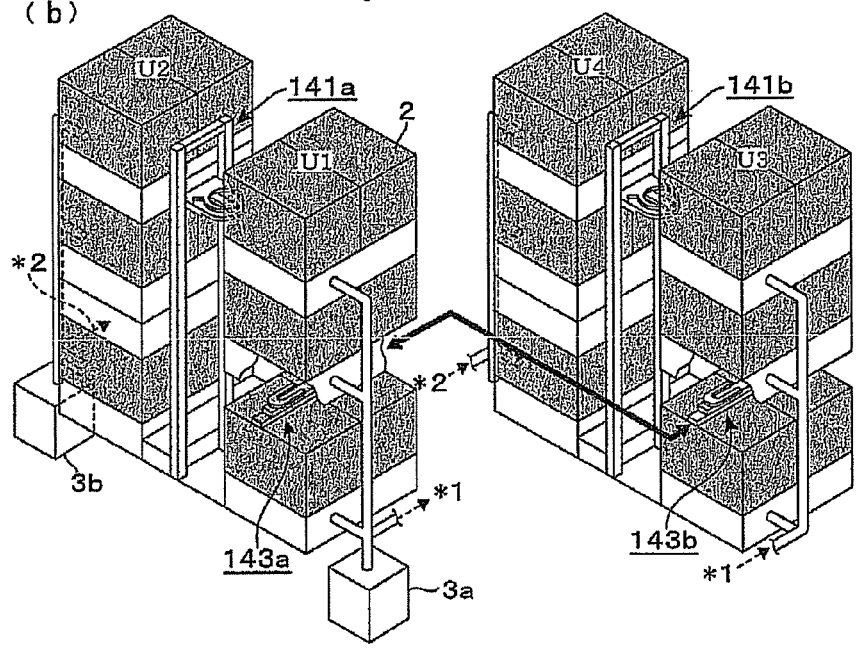

SUBSTRATE PROCESSING APPARATUS

This application is based on and claims priority from Japanese Patent Application No. 2009-232056 filed on Oct. 6, 2009 with the Japanese Patent Office, the disclosure of which is incorporated herein in its entirety by reference.

TECHNICAL FIELD

The present disclosure relates to a technology in which a substrate transferring device is used for transferring substrates such as semiconductor wafers, for example, to a plurality of processing units performing a fluid processing such as a liquid processing or a surface processing for the substrates and then the substrates are processed.

BACKGROUND

In a process for manufacturing a semiconductor device etc., a liquid processing has been known that supplies the surface of a substrate such as a semiconductor wafer (hereinafter, referred to as "wafer") with a processing liquid such as a chemical liquid or deionized water (DIW) to remove particles or contaminants adhered on the substrate.

As an example of a liquid processing apparatus configured to perform this liquid processing, a liquid processing apparatus has been known that places substrates on a spin-chuck one by one, supplies a processing liquid to the surface of the substrate while rotating the substrate, thereby performing the liquid processing. For example, there is a liquid processing apparatus of this type in which the substrates are transferred to a plurality of liquid processing units capable of performing the same kind of liquid processing by using a common substrate transfer device, and the substrates are continuously replaced while performing the liquid processing by the plurality of liquid processing units thereby improving the number of substrates (throughputs) processed per unit time. See, for example, Japanese Patent Laid-open Publication No. 2008-34490, paragraph [0020] and FIG. 1.

The present inventors have considered a method that significantly increases the throughput of the liquid processing apparatus having such a structure, and increases the number of substrates capable of being processed in parallel by providing a plurality of processing blocks each configured to transfer substrates to the plurality of liquid processing units by using a common substrate transferring device, in one liquid processing apparatus.

However, as the number of substrates capable of being processed in one liquid processing apparatus is increased, losses are increased by stopping the liquid processing apparatus when either one of liquid processing unit, a substrate transfer device, or a processing liquid supply system for liquid processing unit and the like has a trouble. In particular, in a case when a plurality of processing blocks are provided within the liquid processing apparatus as described above, although it would be possible to continue the operation of the processing blocks except a trouble point, an opportunity loss will occur upon stopping the entire apparatus, thereby disturbing the effective operation of the liquid processing apparatus.

Here, Japanese Patent Application Laid-open Publication No. 2004-87675 (paragraph [0040], [0108], FIGS. 1 to 3) discloses a coating and developing apparatus that performs a series of process, such as a coating process of an applying liquid to a semiconductor wafer, a heating process, and a developing process after the exposure. In particular, the coating and developing apparatus is provided with a plurality of processing lines configured to perform a series of processes, and it is possible to continue operating the residual processing lines even when a device included in one processing line is out of order.

In the coating and developing apparatus described in Japanese Patent Application Laid-open Publication No. 2004-87675, when any device belonging to each processing line is broken, the processing line containing the broken device needs to be stopped entirely, regardless of the broken point. In contrast, as described above, in a case where there are provided a plurality of liquid processing blocks each configured to transfer substrates to a plurality of liquid processing units by means of one substrate transfer device, even when a trouble occurs in the device needed to operate a certain liquid processing block, it is sometimes possible to continue the liquid processing by other liquid processing units included in the liquid processing block. As a result, it is often the case that the liquid processing apparatus cannot be operated efficiently despite of applying the technique described in Japanese Patent Application Laid-open Publication No. 2004-87675.

SUMMARY

According to an exemplary embodiment, there is provided a substrate processing apparatus including (a) a substrate introduction block having a container placement portion configured to place a substrate storage container having substrates stored therein, and a transfer device configured to transfer the substrates with the substrate storage container placed on the container placement portion; (b) a first processing block placed adjacent to the substrate introduction block, configured to process the substrates received from the substrate introduction block, and having a first substrate conveying device configured to convey the substrates along a straight conveying path, and a first processing unit array comprised of a plurality of processing units each configured to perform the same process with a processing liquid, where the first processing unit array is provided at both sides of the first substrate conveying device, and the substrates are conveyed to the plurality of processing units of the first processing unit array by the first substrate conveying device; (c) a second processing block placed adjacent to the first processing block, configured to process the substrates received from the substrate introduction block, and having a second substrate conveying device configured to convey substrates along a straight conveying path, and a second processing unit array comprised of a plurality of processing units each configured to perform the same process as the plurality of processing units of the first processing unit, where the second processing unit array is provided at both sides of the second substrate conveying device, and the substrates are conveyed to the plurality of processing units of the second processing unit array by the second substrate conveying device; (d) a first processing fluid supply system commonly provided with respect to the first processing unit array of one side at the first processing block and the second processing unit array of one side at the second processing block; (e) a second processing fluid supply system commonly provided with respect to the first processing unit array of the other side at the first processing block and the second processing unit array of the other side at the second processing; and (f) a control unit configured to process the substrates using the other processing block when one of the first and second substrate conveying devices has a trouble, and to process the substrates using the processing unit array that belongs to a processing fluid supply system having no trouble when one of the first and second processing fluid supply systems has a trouble.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 7 is a group classification table grouping defining an array of the liquid processing unit to be stopped depending on the point where a trouble occurs, in the liquid processing apparatus.

FIG. 9 is a first explanatory view illustrating the operation of the liquid processing apparatus.

FIG. 15 is a second explanatory view illustrating the operation of the liquid processing apparatus according to the second embodiment.

DETAILED DESCRIPTION

Figure 1:
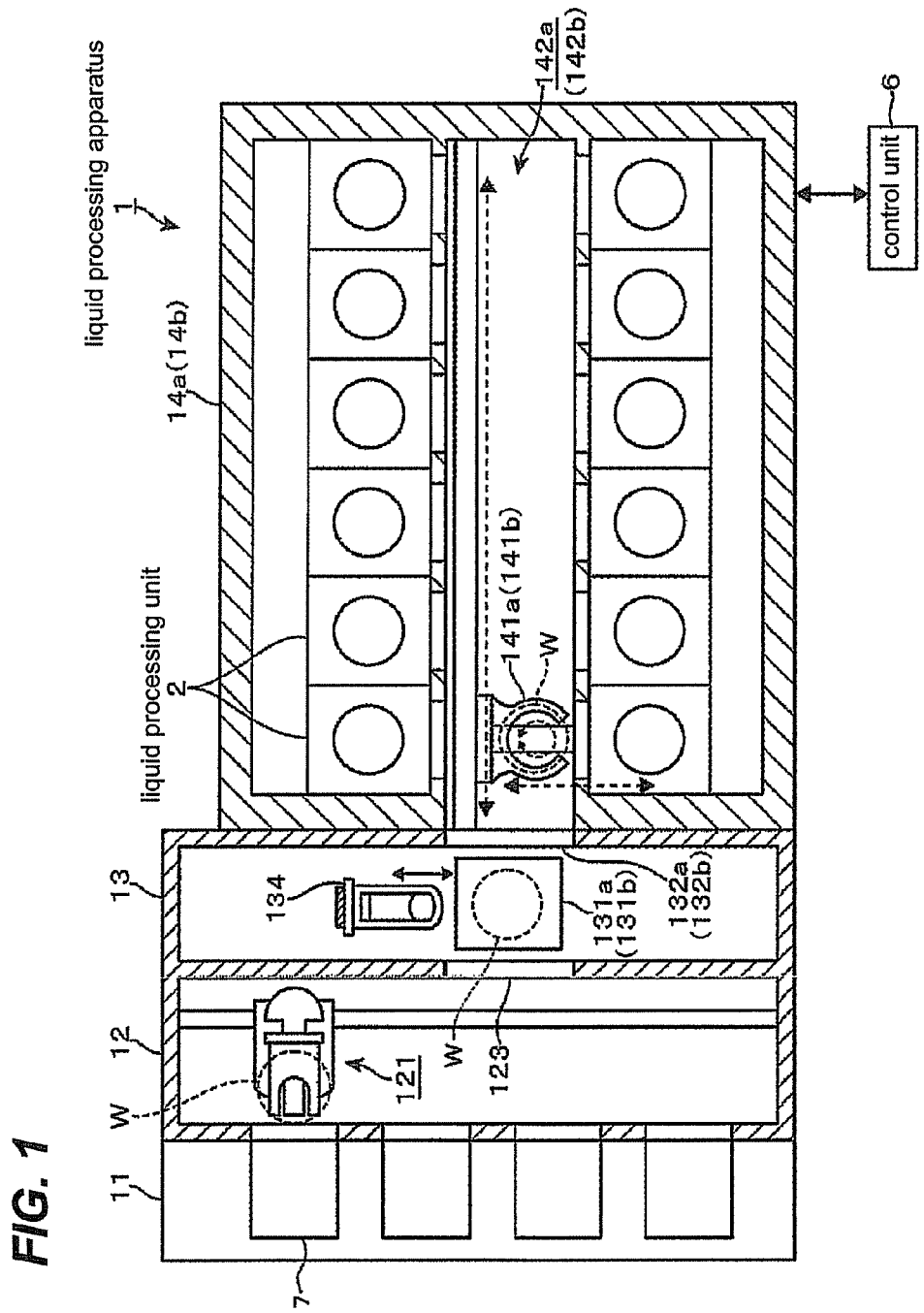
FIG. 1 is a cross-sectional plan view of a liquid processing apparatus according to an embodiment of the present disclosure.

In the following detailed description, reference is made to the accompanying drawings, which form a part hereof. The illustrative embodiments described in the detailed description, drawings, and claims are not meant to be limiting. Other embodiments may be utilized, and other changes may be made, without departing from the spirit or scope of the subject matter presented here.

The present disclosure is accomplished in view of such circumstances, and aims to provide a substrate processing apparatus in which even when a trouble occurs, it is possible to continue performing a substrate processing without stopping the substrate processing apparatus entirely.

According to an aspect of the present disclosure, there is provided a substrate processing apparatus including (a) a substrate introduction block having a container placement portion configured to place a substrate storage container having substrates stored therein, and a transfer device configured to transfer the substrates with the substrate storage container placed on the container placement portion; (b) a first processing block placed adjacent to the substrate introduction block, configured to process the substrates received from the substrate introduction block, and having a first substrate conveying device configured to convey the substrates along a straight conveying path, and a first processing unit array comprised of a plurality of processing units each configured to perform the same process with a processing liquid, where the first processing unit array is provided at both sides of the first substrate conveying device, and the substrates are conveyed to the plurality of processing units of the first processing unit array by the first substrate conveying device; (c) a second processing block placed adjacent to the first processing block, configured to process the substrates received from the substrate introduction block, and having a second substrate conveying device configured to convey substrates along a straight conveying path, and a second processing unit array comprised of a plurality of processing units each configured to perform the same process as the plurality of processing units of the first processing unit, where the second processing unit array is provided at both sides of the second substrate conveying device, and the substrates are conveyed to the plurality of processing units of the second processing unit array by the second substrate conveying device; (d) a first processing fluid supply system commonly provided with respect to the first processing unit array of one side at the first processing block and the second processing unit array of one side at the second processing block; (e) a second processing fluid supply system commonly provided with respect to the first processing unit array of the other side at the first processing block and the second processing unit array of the other side at the second processing; and (f) a control unit configured to process the substrates using the other processing block when one of the first and second substrate conveying devices has a trouble, and to process the substrates using the processing unit array that belongs to a processing fluid supply system having no trouble when one of the first and second processing fluid supply systems has a trouble.

The substrate processing apparatus may include the following features.

When a trouble occurs at a processing unit, the control unit may control to stop using the processing unit array containing the processing unit and process the substrates by another processing unit array.

The first processing block and the second processing block may be stacked on each other.

The second processing block may be provided on the opposite side of the substrate introduction block with respect to the first processing block.

The substrate processing apparatus further includes, a substrate placement portion configured to transfer substrates between the first processing block and the second processing block; a first interblock conveying device provided independently of the first conveying device, and configured to convey the substrates received from the substrate introduction block to the first processing block or the substrate placement portion; and a second interblock conveying device provided independently of the second conveying device, and configured to convey the substrates placed on the substrate placement portion to the second processing block.

According the present disclosure, the combination of processing unit array in which the substrates are transferred by each substrate conveying device differs from the combination of processing unit array that is connected to each processing fluid supply system commonly provided. Therefore, even when a trouble occurs at one substrate conveying device, for example, it is possible to continue processing substrates using the other substrate transfer device, and in this state, even though a further trouble occurs at one processing fluid supply system, there is at least a processing unit array left being able to continue processing the substrates using the other substrate transfer device and the other processing fluid supply system with no trouble. As a result, it is possible to increase the possibility to continuously process the substrates without stopping the substrate processing apparatus entirely for an occurred trouble.

Hereinafter, an exemplary embodiment as a non-limiting example of the present disclosure will be described with reference to appended drawings. In all of the appended drawings, the same or corresponding members (or components) are designated with the same or corresponding reference numerals to omit repeated descriptions.

Figure 2:
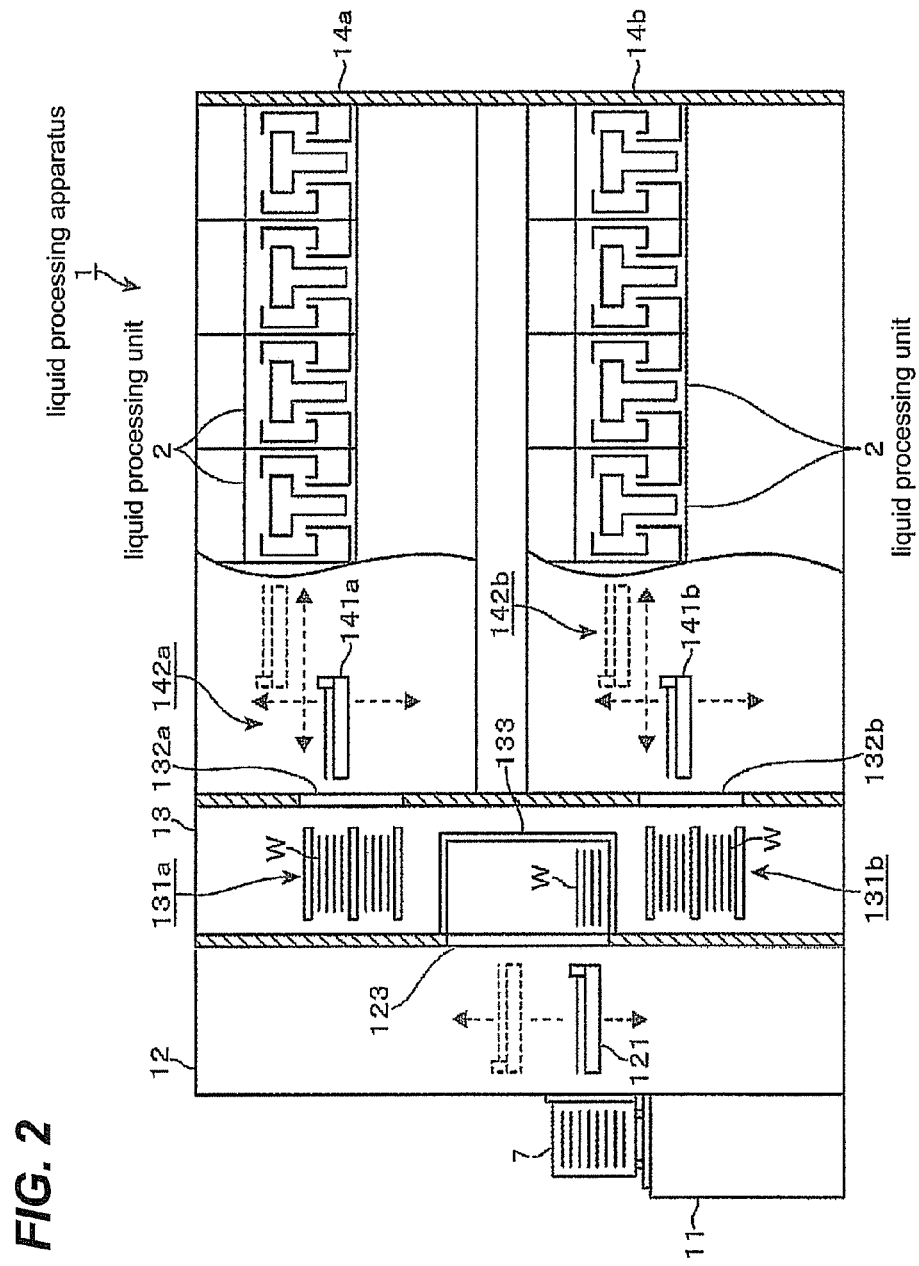
FIG. 2 is a longitudinal sectional side view of the liquid processing apparatus.

As a liquid processing apparatus according to the present disclosure, a liquid processing apparatus 1 will be described with reference to FIGS. 1 to 7. Liquid processing apparatus 1 is configured to supply a chemical liquid as a processing liquid to a wafer W as a substrate to perform a liquid processing for removing particles or contaminants adhered on the substrate. FIG. 1 is a cross-sectional plan view showing the entire configuration of liquid processing apparatus 1, FIG. 2 is a longitudinal sectional side view of the same. Assuming that the left side in these figures is the front side, liquid processing apparatus 1 has a placement block 11 configured to place FOUP (Front-opening Unified Pod) 7 as a substrate storage container having a plurality of wafers W stored therein, a transfer block 12 configured to take wafer W out of FOUP 7 and to carry the wafer into liquid processing apparatus 1, a transfer block 13 configured to transfer wafer W taken out by conveying block 12 into a liquid processing block 14a, 14b at the rear stage, and liquid processing block 14a, 14b configured to carry wafer W transferred from transfer block 13 into liquid processing unit 2 and to perform a liquid processing. It is noted that the components are connected in this order from the front side. Herein, in view of the throughput enhancement, liquid processing apparatus 1 according to the present embodiment includes two liquid processing blocks 14a, 14b stacked on each other (disposed adjacent to each other) in a vertical direction. For example, in the present embodiment, liquid processing block 14a in the upper stage side corresponds to the first processing block, and liquid processing block 14b in the lower stage side corresponds to the second processing block.

Placement block 11 is constructed as a placement table capable of placing, for example, four FOUPs 7, and serves as a container placement portion that fixes each FOUP 7 placed on the placement table and connects it to transfer block 12. Transfer block 12 is configured to provide an opening/closing device (not shown) configured to open/close an open/close door provided in a connection surface with each FOUP 7 and a carry-in/carry-out arm 121 configured to transfer wafer W between FOUP 7 and transfer block 13 within a common casing.

For example, carry-in/carry-out arm 121 has a transfer arm configured to advance/retreat in the front/rear directions, to move in the right/left directions, to rotate and to elevate and a driving unit thereof. Carry-in/carry-out arm 121 serves to transfer wafer W between transfer block 13 through a first opening 123 provided in a partition wall for defining transfer block 12 from transfer block 13.

Transfer block 13 is a space within the casing provided at the position interposed between transfer block 12 and liquid processing blocks 14a, 14b in the front/rear direction. For example, transfer block 13 is provided with a first transfer shelf 133 connected to first opening 123 at transfer block 12 side, and second transfer shelves 131a, 131b each located above and below first transfer shelf 133 and configured to transfer wafer W before and after a liquid processing between first transfer shelf 133 and second openings 132a, 132b provided in the partition wall at each liquid processing block 14a, 14b side. For example, eight wafers W can be placed on each second transfer shelf 131a, 131b, and each second transfer shelf 131a, 131b is provided at the upper position and the lower position in the space of transfer block 13. Each second transfer shelf 131a, 131b plays a role to temporarily place wafer W introduced from transfer block 12 side and wafer W delivered out of liquid processing blocks 14a, 14b sides.

Further, as shown in FIG. 1, transfer block 13 is provided at its inner space with an elevate-transfer device 134 configured to move in the vertical directions and to advance/retreat in the front/rear directions. Elevate-transfer device 134 plays a role to transfer wafer W between first transfer shelf 133 and second transfer shelves 131a, 131b.

Placement block 11, transfer block 12, and transfer block 13 described above constitute a substrate introduction block of the present embodiment.

In the rear end of transfer block 13 and adjacent to transfer block 13, two liquid processing blocks 14a, 14b are stacked vertically. Each configuration of liquid processing blocks 14a, 14b is substantially equivalent to each other, and a plurality of, for example, twelve liquid processing units 2 configured to perform a liquid processing for wafer W are disposed within the casing. Each liquid processing block 14a, 14b is provided with transfer paths 142a, 142b as straight conveying paths of wafer W extending in the front/rear direction, and six liquid processing units 2 are arranged in a row on opposite sides of conveying paths 142a, 142b, respectively.

Figure 3:
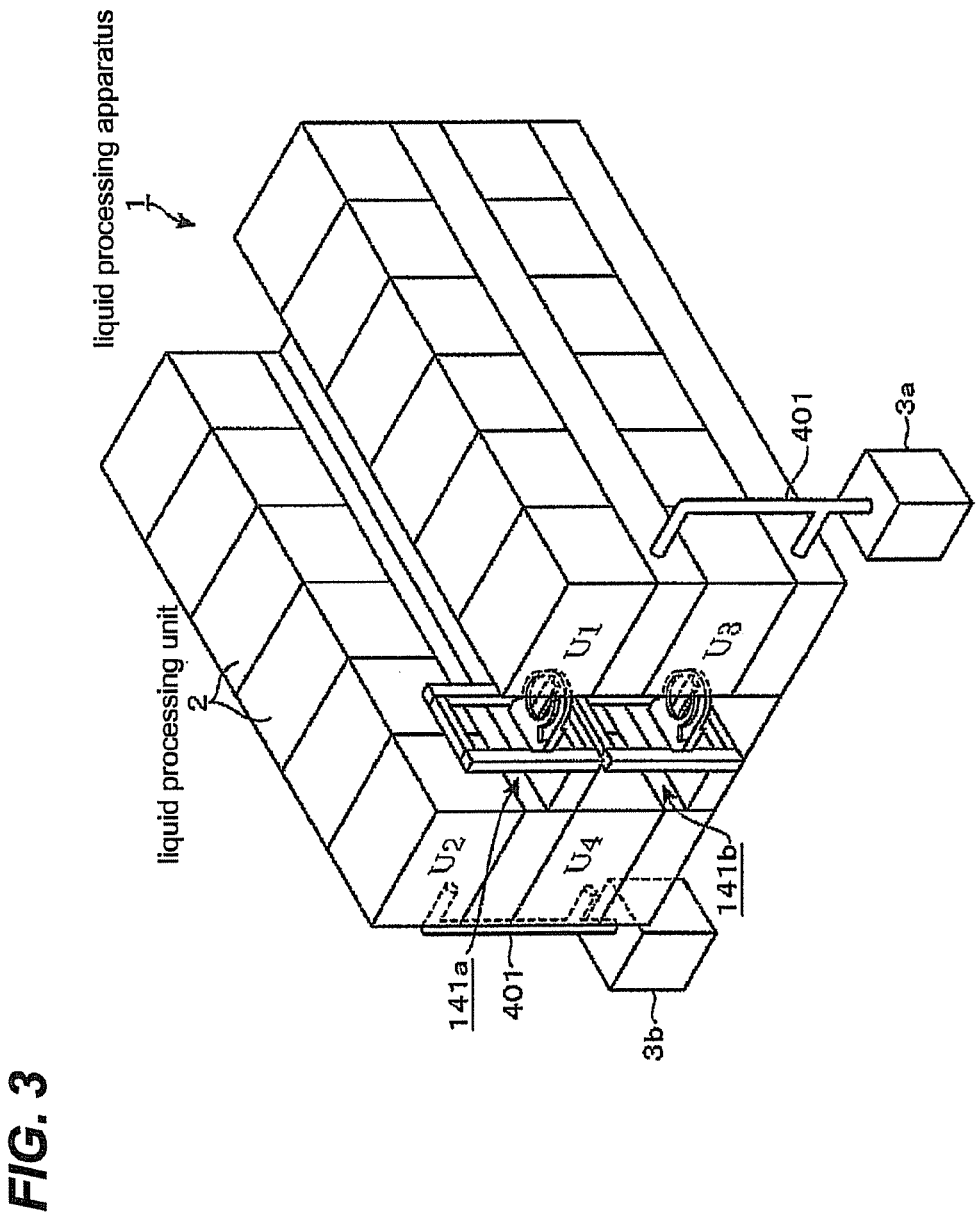
FIG. 3 is a perspective view illustrating the internal configuration of the liquid processing apparatus.

As shown in FIGS. 1 and 3, each transfer path 142a, 142b is provided with process arms 141a, 142b which are allowed to move along conveying paths 142a, 142b to advance towards and retreat from each liquid processing unit 2 provided at left and right sides of conveying paths 142a, 142b, allowed to rotate about a vertical axis, and allow to elevate up/down. Each process arm 141a, 142b corresponds to the first and second substrate transfer devices of the present embodiment, and can transfer wafer W between the second transfer shelf 131a, 131b corresponding to each liquid processing block 14a, 14b at transfer block 13 side and each liquid processing unit 2. Herein, in FIGS. 1 to 3, each liquid processing block 14a, 14b is provided with one process arm 141a, 141b, but may be provided with two or more process arms 141a, 141b depending on the number of liquid processing unit 2.

In summary for the above description, in liquid processing apparatus 1 of the present embodiment, twelve liquid processing units 2 are provided in liquid processing block 14a of the upper stage side and twelve liquid processing units 2 are provided in liquid processing block 14b of the lower stage side, so the total number of liquid processing unit 2 is 24, as shown in FIGS. 1 to 3. Also, in liquid processing block 14a of the upper stage side, the common process arm 141a carries-in/carries-out wafer W with respect to liquid processing unit 2 included in a first liquid processing unit array U1 having six liquid processing units 2 that are arranged in a row on the right side of conveying path 142a and a second liquid processing unit array U2 having six liquid processing units 2 that are arranged in a row on the left side of conveying path 142a, as seen from the front. Also, in liquid processing block 14b of the lower stage side, the common process arm 142a carries-in/carries-out wafer W with respect to liquid processing unit 2 included in a third liquid processing unit array U3 having six liquid processing units 2 that are arranged in a row on the right side of conveying path 142b and a fourth liquid processing unit array U4 having six liquid processing units 2 that are arranged in a row on the left side of conveying path 142b, as seen from the front.

Figure 4:
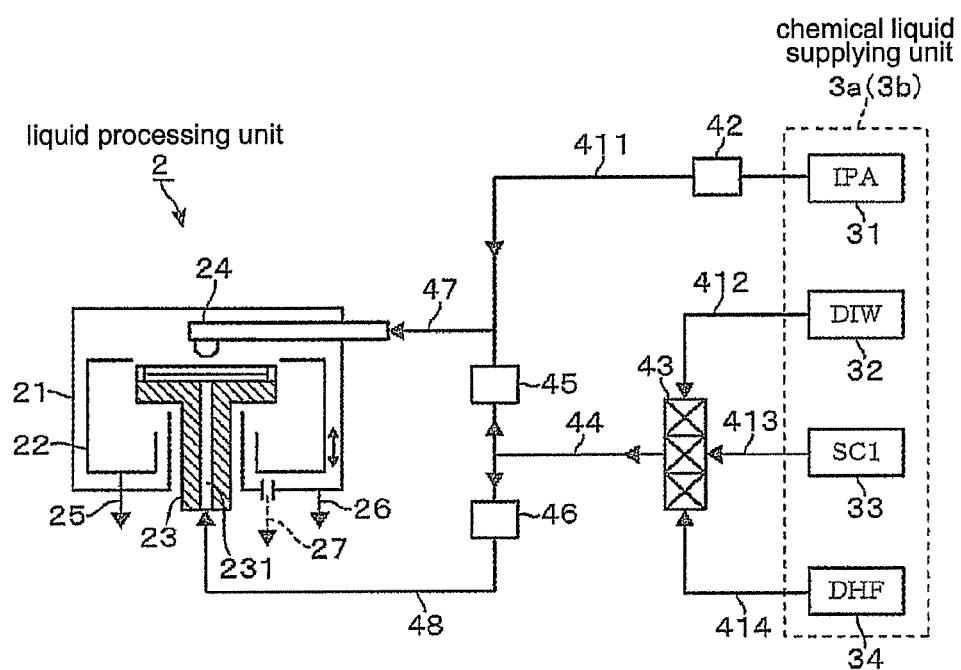
FIG. 4 is an explanatory view illustrating the configuration of a liquid processing unit mounted on the liquid processing apparatus.

Next, the configuration of liquid processing unit 2 provided in each liquid processing block 14a, 14b, the supply system for supplying a chemical liquid to each liquid processing unit 2 and the collecting system for collecting the chemical liquid will be described with reference to FIGS. 4 and 5. Liquid processing unit 2 is provided with an outer chamber 21 configured to form an enclosed processing space where each of a liquid processing, a rinse cleaning and a spin drying for wafer W is done, a wafer holding device 23 provided in outer chamber 21 and configured to rotate wafer W while holding it substantially horizontally, a nozzle arm 24 configured to supply a chemical liquid to the upper surface of wafer W held by wafer holding device 23, and an inner cup 22 provided within outer chamber 21 to surround wafer holding device 23 and configured to receive the chemical liquid scattered from the rotating wafer W to the surrounding area.

Outer chamber 21 is provided within a casing separated from another liquid processing unit 2 placed adjacent to each other, as shown in FIGS. 1 to 3. Wafer W is carried-in/carried-out by process arm 141a, 141b through a wafer introduction opening which is not shown. Reference numeral 26 denotes a drain line configured to discharge a drained water, such as DIW (deionized water), gathered in the bottom surface of outer chamber 21 and reference numeral 27 denotes an exhaust line configured to discharge an atmosphere within outer chamber 21, which are provided in the bottom surface of outer chamber 21. Also, wafer holding device 23 is formed at its interior with a chemical liquid supply path 231 through which a chemical liquid can be supplied to the lower surface of the rotating wafer W.

A nozzle for supplying a chemical liquid is provided at the front end of nozzle arm 24 and is movable by a driving device (not shown) between an upper position located at the center side of wafer W held by wafer holding device 23 and a standby position located outside of outer chamber 21, for example. Inner cup 22 elevates up/down direction between a processing position surrounding wafer W held by wafer holding device 23 and a retreat position retreated downwards from the processing position, and plays a role to receive various chemical liquids supplied to the surface of rotating wafer W and thus to discharge the chemical liquids to the outside of liquid processing unit 2 through a drain line 25 provided in the bottom surface of inner cup 22.

Next, a mechanism for supplying a chemical liquid to each liquid processing unit 2 will be described. The nozzle provided in nozzle arm 24 is connected with an upper-side supply line 47, and upper-side supply line 47 branches into an IPA supply line 411 and a chemical liquid supply intermediate line 44. IPA supply line 411 is connected with an IPA supplying portion 31, and IPA supplying portion 31 plays a role to supply IPA for drying wafer W with its high volatility to the upper surface side of wafer W. A mass flow controller 42 is provided in IPA supply line 411, and thereby a predetermined amount of IPA can be supplied to nozzle arm 24a.

Other chemical liquid supplying intermediate line 44 that is branched from upper-side supply line 47 is connected with chemical liquid supply lines 412, 413, 414 of three way systems via a switching valve 43. A DIW supplying portion 32 configured to supply DIW (DeIonized Water) as a rinse solution for removing DHF solution or SC1 solution remained in wafer W after the chemical liquid processing is provided in the upstream side of a DIW supply line 412. A SC1 supplying portion 33 configured to supply SC1 solution (a mixing solution of ammonia and oxygenated water) as a chemical liquid for removing particles and organic contaminants adhered on the surface of wafer W is provided the upstream side of a SC1 supply line 413. And, a DHF supplying portion 34 configured to supply a diluted hydrofluoric acid aqueous solution (hereinafter referred to as "DHF solution") as an acidic solution for removing a natural oxide film on the surface of wafer W is provided in the upstream side of a DHF supply line 414.

Further, chemical liquid supplying intermediate line 44 connected with DIW supplying portion 32, SC1 supplying portion 33 and DHF supplying portion 34 is also connected with chemical liquid supplying path 231 configured to supply the chemical liquid to the lower surface of wafer W, via a lower-side supply line 48. In FIG. 4, a mass flow controller configured to control the supply amount of the chemical liquid to nozzle arm 24 side is designated by a reference numeral 45, and a mass flow controller configured to control the supply amount of the chemical liquid to wafer holding device 23 side is designated by a reference numeral 45.

Figure 5:
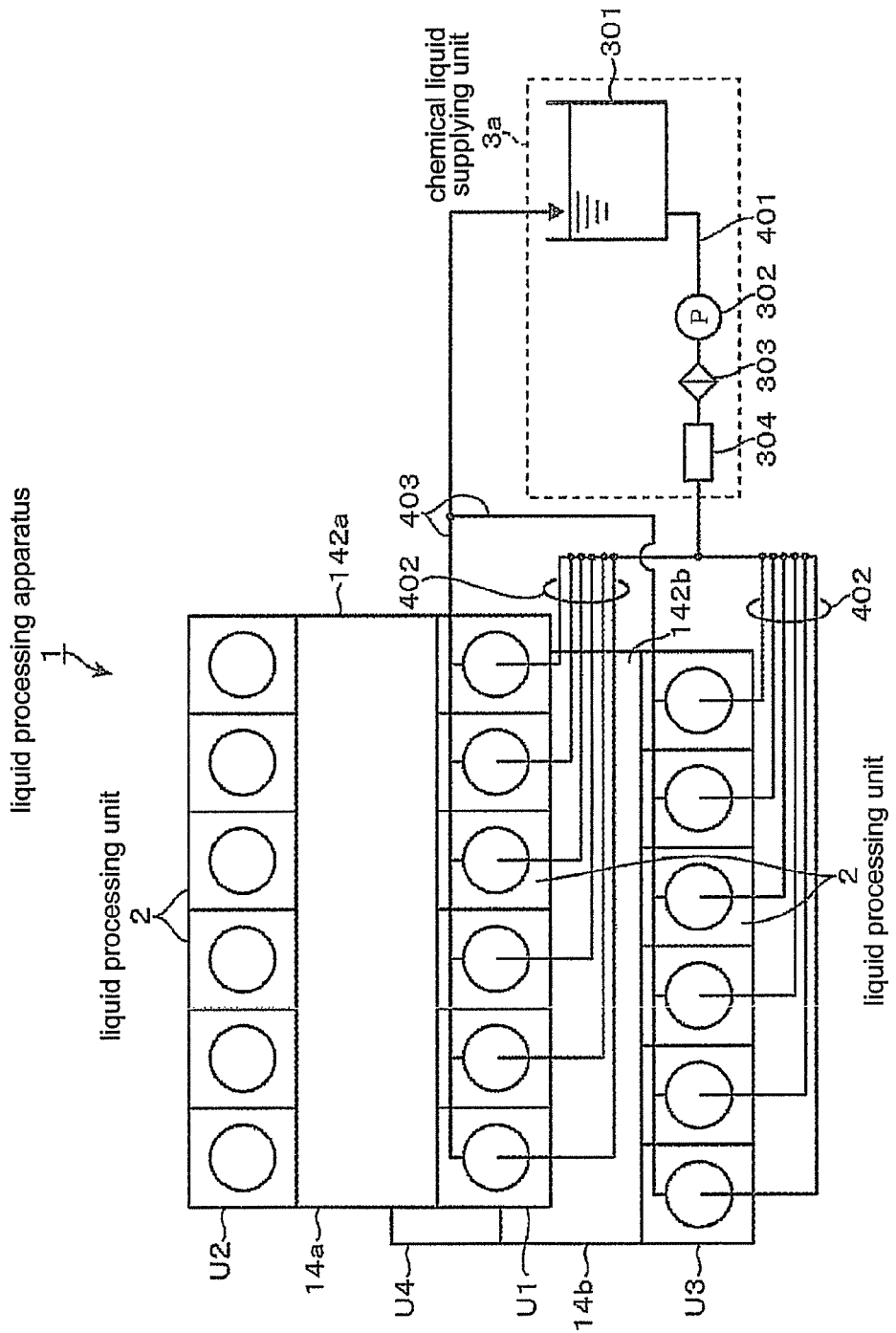
FIG. 5 is an explanatory view illustrating a system for supplying a processing liquid to the liquid processing unit.

For example, IPA supplying portion 31, DIW supplying portion 32, SC1 supplying portion 33 and DHF supplying portion 34 described above are disposed together within a common chemical liquid supplying unit 3a, 3b, and these supplying portions 31, 32, 33, 34 as a whole are illustrated together in FIG. 5, for example. Herein, in liquid processing apparatus 1 according to the present embodiment, first liquid processing unit array U1 and third liquid processing unit array U3 stacked vertically on the right side of conveying paths 142a, 142b, as seen from the front, are connected with common chemical liquid supplying unit 3a, and second liquid processing unit array U2 and fourth liquid processing unit array U4 stacked vertically on the left side of conveying path 142a, 142b as seen from the front, are connected with common chemical liquid supplying unit 3b, as shown in FIGS. 3 and 5. These common chemical liquid supplying units 3a, 3b correspond to a supply system of a processing fluid in the present embodiment, and each supply system is commonly provided with respect to liquid processing unit arrays U1, U3 and U2, U4.

As described above, chemical liquid supplying units 3a and 3b are connected respectively with liquid processing unit arrays U1, U3 and U2, U4 on opposite sides of conveying paths 142a, 142b. So, for example, each supply line 411-414 and the like can be disposed without interfering with process arm 141a, 141b, the power supply system thereof and the like. Consequently, there are advantages that the piping design can be simplified and the piping length can be shortened. Furthermore, for the convenience of illustration, FIG. 5 shows representatively the state that chemical liquid supplying unit 3a is connected with liquid processing unit arrays U1, U3, but chemical liquid supplying unit 3b and liquid processing unit arrays U2, U4 are connected to each other in the same way.

As generally illustrated in FIG. 5, supplying portions 31, 32, 33, 34 of each chemical liquid have a configuration that a supply pump 302, a filter 303 and a heater 304 are provided in a chemical liquid supply line 401 connected with a circulation tank 301 accommodating various chemical liquids. And, at the downstream side thereof, chemical liquid supply line 401 branches into branch lines 402 connected with each liquid processing unit 2 of liquid processing block 14a, 14b. Chemical liquid supply lines 401 and branch lines 402 correspond to each supply line 412~413 shown in FIG. 4. For example, the branch lines 402 of each chemical liquid supply line 401 join together at switching valve 43 provided at the lower side of each liquid processing unit 2.

Meanwhile, drain line 25 provided in the bottom portion of inner cup 22 of each liquid processing unit 2 is connected, for example, via a switching valve (not shown), with a chemical liquid collecting line 403 configured to collect a chemical liquid to circulation tank 301 of each supplying portion 31, 33, 34. Therefore, a used chemical liquid can be collected. Further, drain line 26 of outer chamber 21 is connected with, for example, a drained water processing equipment of a factory, and does not collect a drained water, instead of collecting a drained water through chemical liquid collecting line 403 to circulation tank 301 of DIW supplying portion 32, unlike the chemical liquid collection line 403 of each chemical liquid supplying portions 31, 33, 34 shown in FIG. 5.

Chemical liquid supplying units 3a, 3b of the above configuration can be disposed, for example, below a floor of a factory at which liquid processing apparatus 1 is located. FIG. 3 shows schematically the arrangement of chemical liquid supplying unit 3a, 3b connected with liquid processing unit arrays U1, U3 and U2, U4. In FIG. 3, chemical liquid supply line 401 connected with supplying portion 31, 32, 33, 34 of each chemical liquid is shown briefly as one pipe. Further, chemical liquid collecting line 403 is not shown in FIG. 3.

As shown in FIG. 1, a control unit 6 is connected to liquid processing apparatus 1. For example, control unit 6 includes a computer including a CPU and a memory device which stores a program including a group of control steps (commands) related to the operation of liquid processing apparatus 1, and to the movements from the time of carrying wafer W into liquid processing unit 2 of each liquid processing block 14a, 14b and performing a liquid processing to the time of accommodating wafer W after the liquid processing within FOUP 7. This program is stored at a storage medium such as hard disk, compact disk, magneto optical disk, and memory card, and is installed into computer via the storage medium.

Liquid processing apparatus 1 having the configuration described above is configured to, when process arms 141a, 141b or chemical liquid supplying units 3a, 3b, etc., for example, has a trouble, stop the operation of only liquid processing unit 2 affected by this trouble, and continue operating the other liquid processing unit 2. Hereinafter, an explanation of the detailed configuration thereof will be given.

Figure 6:
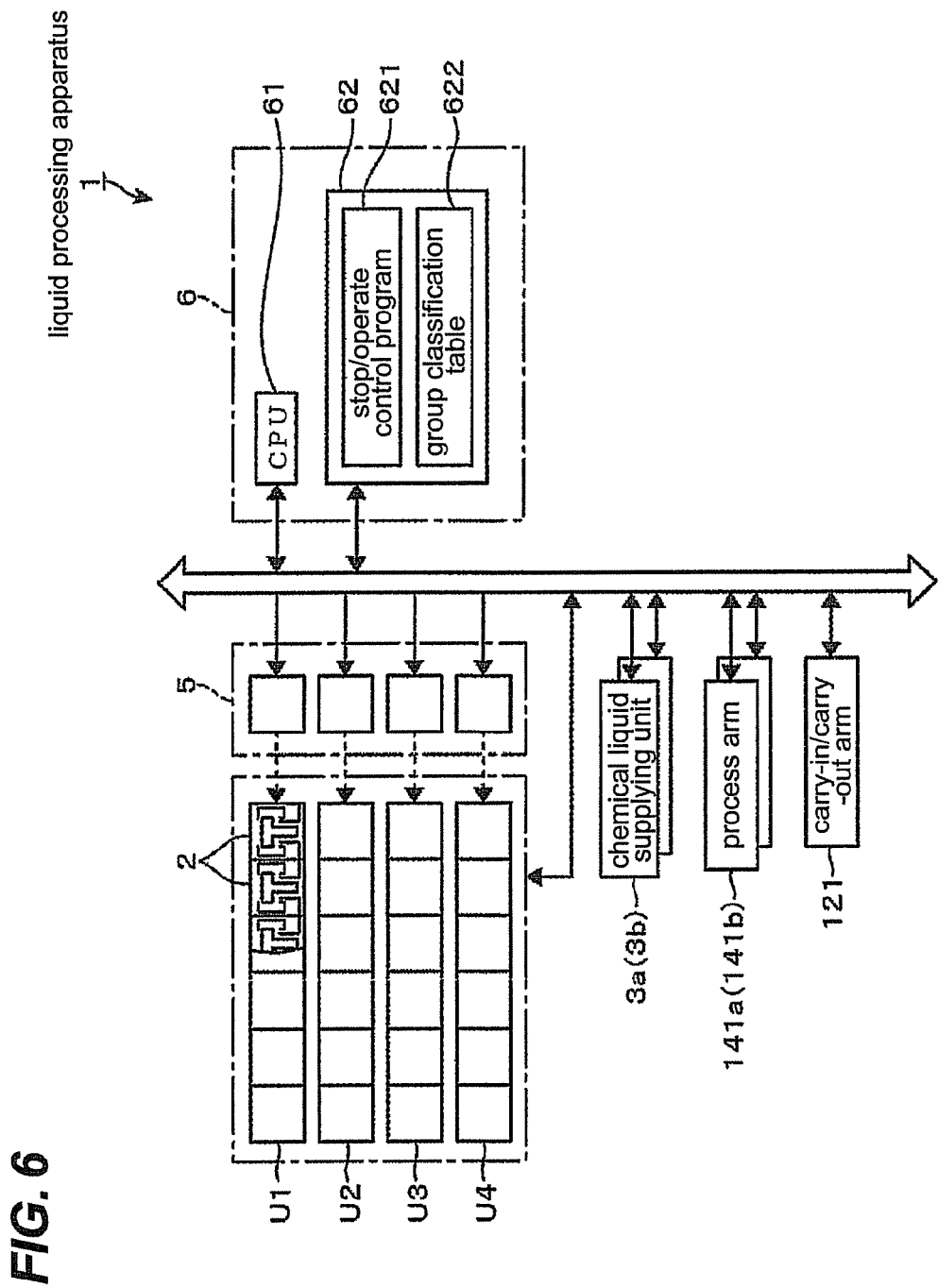
FIG. 6 is an explanatory view illustrating the electrical configuration of the liquid processing apparatus.

FIG. 6 is a block diagram illustrating the electrical configuration of liquid processing apparatus 1. Each liquid processing unit 2, chemical liquid supplying unit 3a, 3b, process arm 141a, 141b, and carry-in/carry-out arm 121 is connected with control unit 6 (which includes, for example, a CPU 61 and a memory device 62) described above, and thereby the trouble occurred in these components 2, 3a, 3b, 141a, 141b, 121 can be detected.

Also, liquid processing units 2 in liquid processing apparatus 1 that belong to each liquid processing unit array U1~U4, are connected to a separate power supply unit 5, and each power supply unit 5 assigned to each liquid processing unit array U1~U4 is configured to supply/shutout the electric power to each liquid processing unit 2 on the basis of the instructions from control unit 6.

For example, a stop/operate control program 621 is stored in memory device 62 of control unit 6. For example, depending on the component 2, 3a, 3b, 141a, 141b, 121 where a trouble occurs, stop/operate control program 621 is configured to change liquid processing unit array U1~U4 in which electric power is to be shutout, with reference to, for example, a group classification table 622 stored in memory device 62, and continue liquid processing wafer W by means of liquid processing unit 2 that belongs to liquid processing unit array U1~U4 in which the electric power is to be supplied.

FIG. 7 shows an example of group classification table 622 according to the present embodiment. In this table 622, each row denotes a component where a trouble occurs, and each column denotes a liquid processing unit arrays U1~U4 to be stopped depending on the component where a trouble has occurred. In this Figure, "O" denotes that liquid processing unit 2 continues operating, and "X" denotes that liquid processing unit 2 stops.

According to group classification table 622 of FIG. 7, when liquid processing unit 2 that belongs to each liquid processing unit array U1~U4 has a trouble, each liquid processing unit array U1~U4 including liquid processing unit 2 with a trouble is only to be stopped, and liquid processing units 2 of the other liquid processing unit array U1~U4 continue operating. The fact that liquid processing unit array U1~U4 other than the stopped liquid processing unit array U1~U4 continues operating, can be also applied to the other components described below.

For process arm 141a, 141b, liquid processing unit arrays U1, U2 are to be stopped in a case that process arm 141a in the upper stage (denoted as "PA1" in FIG. 7) has a trouble, and liquid processing unit arrays U3, U4 are to be stopped in a case that process arm 141b in the lower stage (denoted as "PA2" in FIG. 7) has a trouble. For chemical liquid supplying unit 3a, 3b, liquid processing unit arrays U1, U3 are to be stopped in a case that chemical liquid supplying unit 3a (denoted as "CU1" in FIG. 7) on the right side, as seen from the front, has a trouble, and liquid processing unit arrays U2, U4 are to be stopped in a case that chemical liquid supplying unit 3b (similarly denoted as "CU2" in FIG. 7) on the left side, as seen from the front, has a trouble.

Further, in a case that carry-in/carry-out arm 121 has a trouble, the operation to carry wafer W into any liquid processing block 14a, 14b at the rear stage and the operation to carry wafer W out from the same cannot be performed, so all liquid processing unit arrays U1~U4 are to be stopped.

Hereinafter, the operation of liquid processing apparatus 1 having the configuration as described above will be described. When liquid processing apparatus 1 begins a process, carry-in/carry-out arm 121 takes out wafer W from FOUP 7 placed on placement block 11, and disposes wafer W within first transfer shelf 133. Elevate-transfer device 134 takes out wafer W from first transfer shelf 133, and disposes sequentially wafer W in second transfer shelf 131a, 131b corresponding to each liquid processing block 14a, 14b.

Process arms 141a, 141b in each liquid processing block 14a, 14b receives wafer W from second transfer shelf 131a, 131b, enters into one of liquid processing units 2, and delivers wafer W to wafer holding device 23. When wafer W is held, nozzle arm 24 is moved to the upper position located at the center side of wafer W, and inner cup 22 is elevated to the processing position. At this time, a SC1 solution is supplied from the nozzle on wafer holding device 23 side and chemical liquid supplying path 231 within wafer holding device 23 side to both the upper and lower surfaces of wafer W, while wafer holding device 23 rotates wafer W. As a result, a liquid film of the chemical liquid is formed on wafer W, and thereby a cleaning is performed by an alkaline chemical liquid.

When the cleaning with the alkaline chemical liquid is completed, inner cup 22 is moved towards the retreat position, a rinse cleaning for removing the SC1 solution on the surface of wafer W is performed by supplying DIW to inner cup 22 and chemical liquid supplying path 231 of wafer holding device 23.

When the rinse cleaning is completed, a spin drying is performed, and then inner cup 22 is elevated to the processing position again. At this time, a DHF solution is supplied from nozzle arm 24 and chemical liquid supplying path 231 in wafer holding device 23 to the upper and lower surfaces of wafer W, while wafer holding device 23 rotates wafer W. As a result, a liquid film of the DHF solution is formed on the upper and lower surfaces of wafer W, and thereby a cleaning is performed by an acidic chemical liquid. After a predetermined time is elapsed, inner cup 22 is moved down towards the retreat position, the supply system for supplying the chemical liquid is switched to a DIW supplying mode, and then the rinse cleaning is performed again.

After the rinse cleaning is performed, inner cup 22 is elevated to the processing position, an IPA is supplied to the upper surface of wafer W, while rotating wafer W, and thereby an IPA dry is performed using a volatility of the IPA. And thus, a residual DIW on the surface of wafer W after the rinse cleaning is removed entirely from wafer W. And then, inner cup 22 retreats to the retreat position, a carry-in/carry-out port which is not shown is opened, process arm 141*a*, 141*b* enters into liquid processing unit 2, and then processed wafer W is taken out.

Processed wafer W after the liquid processing is transferred to second transfer shelf 131*a*, 131*b*, vertical conveying device 134, first transfer shelf 133 and carry-in/carry-out arm 121 according to the opposite route as compared when wafer W is carried in, and then is accommodated in FOUP 7 on placement block 11. By performing these operations successively, liquid processing apparatus 1 operates concurrently total 24 liquid processing units 2 in liquid processing block 14*a* of the upper stage and liquid processing block 14*b* of the lower stage. For example, in the present liquid processing apparatus 1, the number of wafer W to be cleaned/dried in a unit time can be increased, in comparison with the conventional liquid processing apparatus that is provided with one set of liquid processing block 14*a* (e.g. twelve liquid processing units 2).

Figure 10:
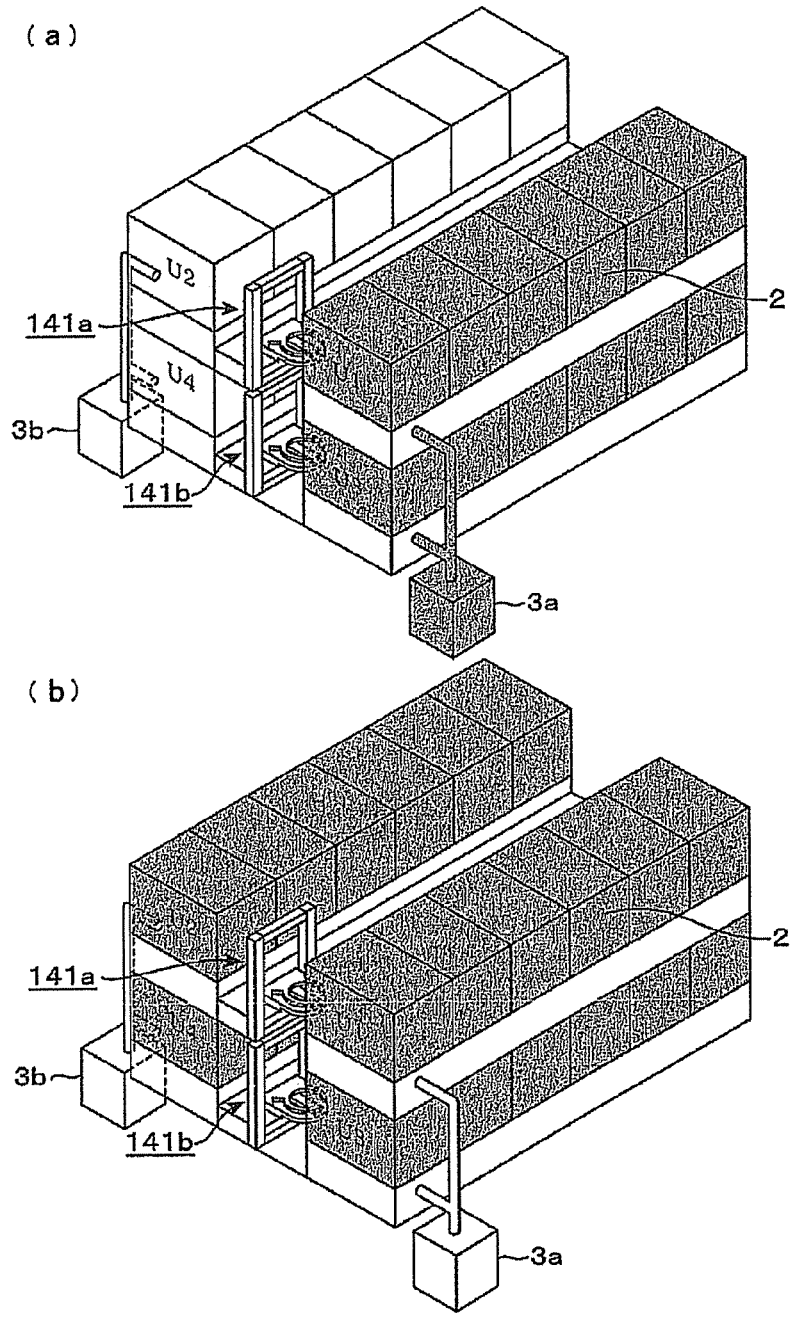
FIG. 10 is a second explanatory view illustrating the operation of the liquid processing apparatus.

On the basis of the operations described above, the operation of liquid processing apparatus 1 performing a liquid processing for wafer W, in a case that a predetermined component of liquid processing apparatus 1 has a trouble, will be described with reference to the flow diagram of FIG. 8 and FIGS. 9, 10.

First, liquid processing apparatus 1 starts an operation (start), and then monitors whether or not each component 2, 3*a*, 3*b*, 141*a*, 141*b*, 121 shown in block diagram of FIG. 6, for example, has a trouble. And, when there is no trouble (Step S101; NO), liquid processing apparatus 1 continues the operation as it is.

When a trouble occurs (Step S101: YES), it is checked whether the trouble has occurred in liquid processing unit 2. In a case that the trouble is related to liquid processing unit 2, for example as in a case of malfunction of a rotation driving unit of wafer holding device 23, a wafer W transfer device and the like (Step S102; YES), only liquid processing unit array U1~U4 including liquid processing unit 2 with a trouble (Step S105) is to be stopped, and then a responding operation for the trouble is finished (End).

For example, FIG. 9 (*a*) shows the operating state of each liquid processing unit array U1~U4 when liquid processing unit 2 belonging to liquid processing unit array U1 has a trouble. In this Figure, liquid processing unit array U1 painted gray denotes that it has been stopped. At this time, in liquid processing unit array U1 which has been stopped, an access door provided in the surface of a casing of liquid processing blocks 14*a*, 14*b*, for example constituting a sheathing body of liquid processing unit array U1, can be opened and maintenance of liquid processing unit 2 having a trouble can be performed, while the other three liquid processing unit arrays U2~U4 continues operating. By stopping the entire liquid processing unit array U1~U4 including liquid processing unit 2 with a trouble, a maintenance staff can be protected from an exposure to an atmosphere where a chemical liquid is supplied when the access door is opened.

Figure 8:
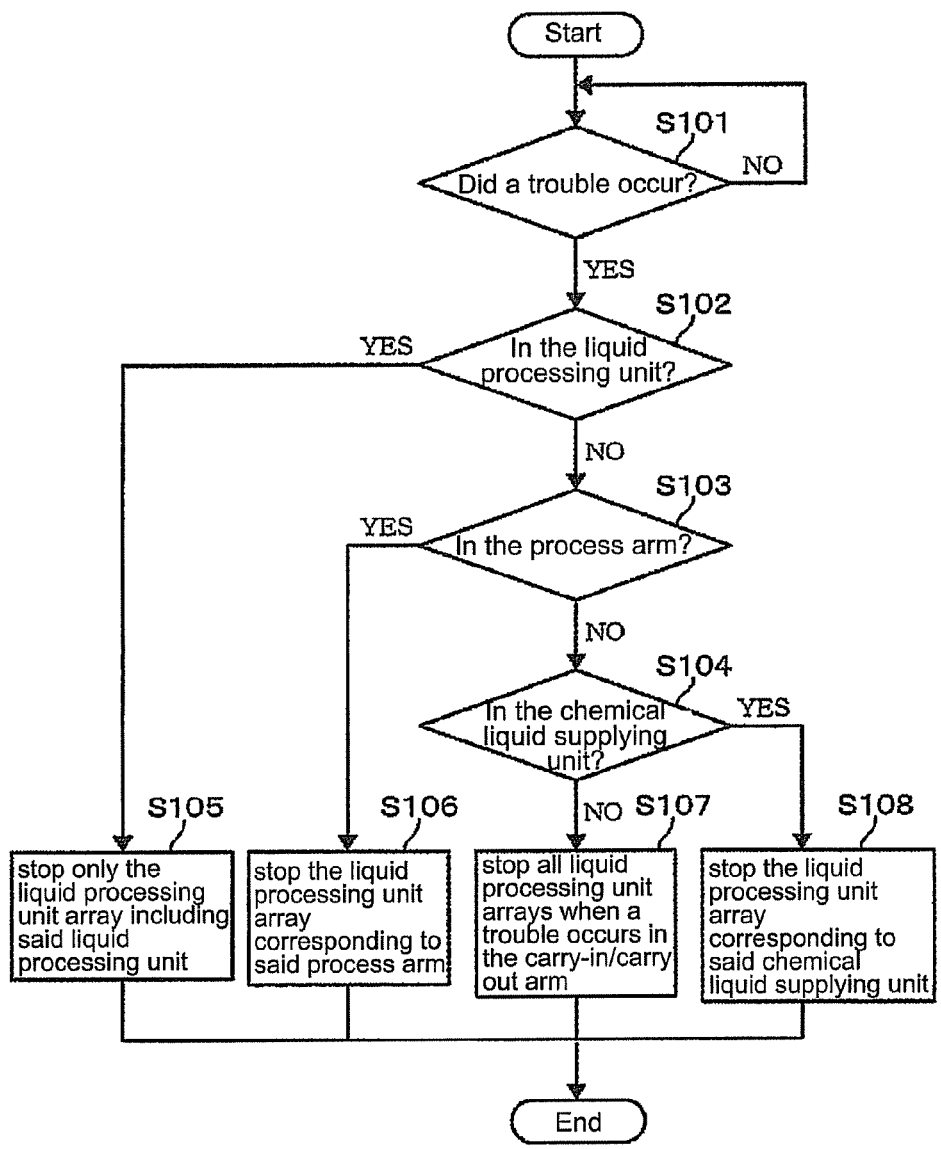
FIG. 8 is a flow diagram showing a flow of operation of the liquid processing apparatus when a trouble occurs therein.

Referring back to the description of the flow diagram in FIG. 8, if it is determined that the trouble is not related to liquid processing unit 2 (Step S102; NO), then it is checked whether the trouble occurs in process arms 141*a*, 141*b*. When the trouble occurs in process arms 141*a*, 141*b*, for example, in a case of a driving device malfunction (Step S103; YES), process arm 141*a*, 142*b* having a trouble is to be stopped based on group classification table 622, along with the corresponding liquid processing unit arrays U1, U2 (or liquid processing unit arrays U3, U4) (Step S106), and then a responding action for the trouble is completed (End). FIG. 9 (*b*) shows the operating state of each liquid processing unit array U1~U4, when process arm 141*a* in the upper stage side has a trouble.

If it is determined that the trouble is not related to process arm 141*a*, 141*b* (Step S103; NO), then it is checked whether the trouble occurs in chemical liquid supplying unit 3*a*, 3*b*. When the trouble occurs in chemical liquid supplying unit 3*a*, 3*b*, for example, in a case of a liquid level down in circulation tank 301, a stop of supply pump 302, increase of pressure loss of filter 303 (Step S104; YES), and the like, chemical liquid supplying unit 3*a*, 3*b* having a trouble is to be stopped based on group classification table 622, along with the corresponding liquid processing unit arrays U1, U3 (or liquid processing unit arrays U2, U4) (Step S108), and then a responding action for the trouble is finished (End). FIG. 10 (*a*) shows the operating state of each liquid processing unit array U1~U4, when chemical liquid supplying unit 3*a* on the right side as seen from the front has a trouble. Herein, in the configuration of liquid processing unit 2 according to the present embodiment, the trouble of liquid processing unit 2 (Step S105) includes the trouble of switching valve 43 or mass flow controller 45, 46 and the like, as shown in FIG. 5.

If it is determined that the trouble is not related to any one of liquid processing unit 2, process arm 141*a*, 141*b* and chemical liquid supplying unit 3*a*, 3*b* (Step S104; NO), then the trouble is related to a driving device of carry-in/carry-out arm 121, etc., for example. For this reason, all of liquid processing unit arrays U1~U4 are to be stopped (i.e., the processing apparatus 1 is to be stopped entirely) (Step S107), and then a responding action for the trouble is finished (End). FIG. 10 (*b*) shows the operating state of each liquid processing unit array U1~U4, when carry-in/carry-out arm 121 has a trouble.

As such, depending on the component 2, 3*a*, 3*b*, 141*a*, 141*b*, 121 where a trouble occurs, only liquid processing unit 2 affected by the trouble is to be stopped. As a result, for example, if a maintenance staff settles the trouble of the corresponding component and the operation start state can be achieved, then a restoring signal is inputted to control unit 6, for example, and the operation of the stopped liquid processing unit array U1~U4 is resumed (start). And then, while one of process arms 141*a*, 141*b* is stopped, for example, even when one of chemical liquid supplying units 3*a*, 3*b* is further stopped, there is at least one liquid processing unit array U1, U2 left being able to continue operating with the other process arm 141*b*, 141*a* and the other chemical liquid supplying unit 3*b*, 3*a*, and thereby a liquid processing can be performed continuously in liquid processing unit 2 of liquid processing unit array U1, U2 having no trouble.

Liquid processing apparatus 1 according to the present embodiment has the following effects. The combination of liquid processing unit array to which the substrate is transferred by each substrate conveying device differs from the combination of liquid processing unit array that is connected to each processing fluid supply system commonly provided. On this account, for example, even when a trouble occurs in one of process arms 141a, 141b, it is possible to perform a liquid processing of wafer W continuously using the other process arm 141b, 141a, and in this state, even though a further trouble occurs in one of chemical liquid supplying units 3a, 3b, there is at least liquid processing unit array U1~U4 left capable of performing the liquid processing of wafer W continuously using the other process arm 141b, 141a and the other chemical liquid supplying unit 3b, 3a having no trouble. As a result, it is possible to increase the possibility to perform the liquid processing of wafer W continuously without stopping liquid processing apparatus 1 entirely for an occurred trouble.

Figure 11:
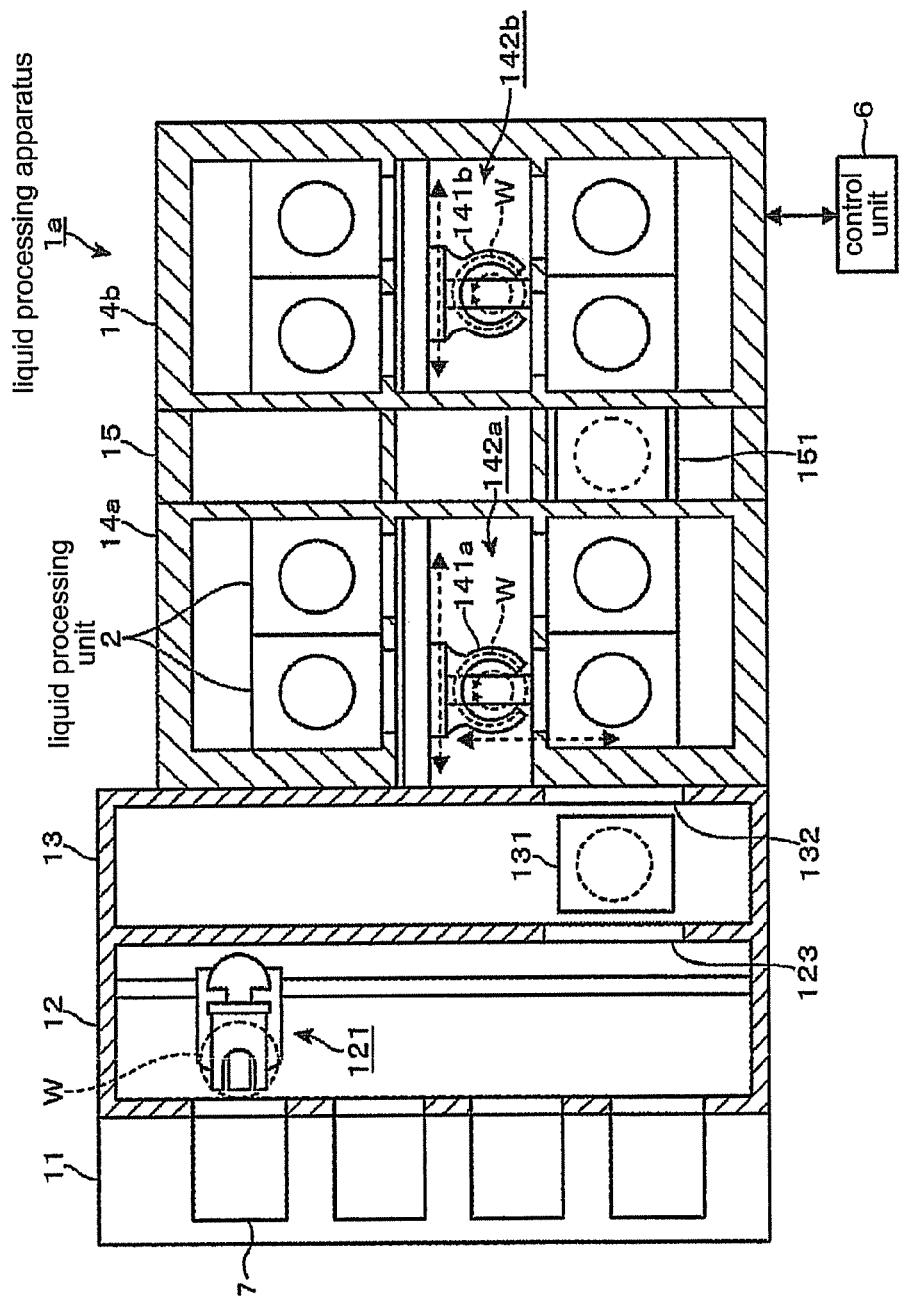
FIG. 11 is a cross sectional plan view illustrating an example of a liquid processing apparatus according to a second embodiment.
Figure 12:
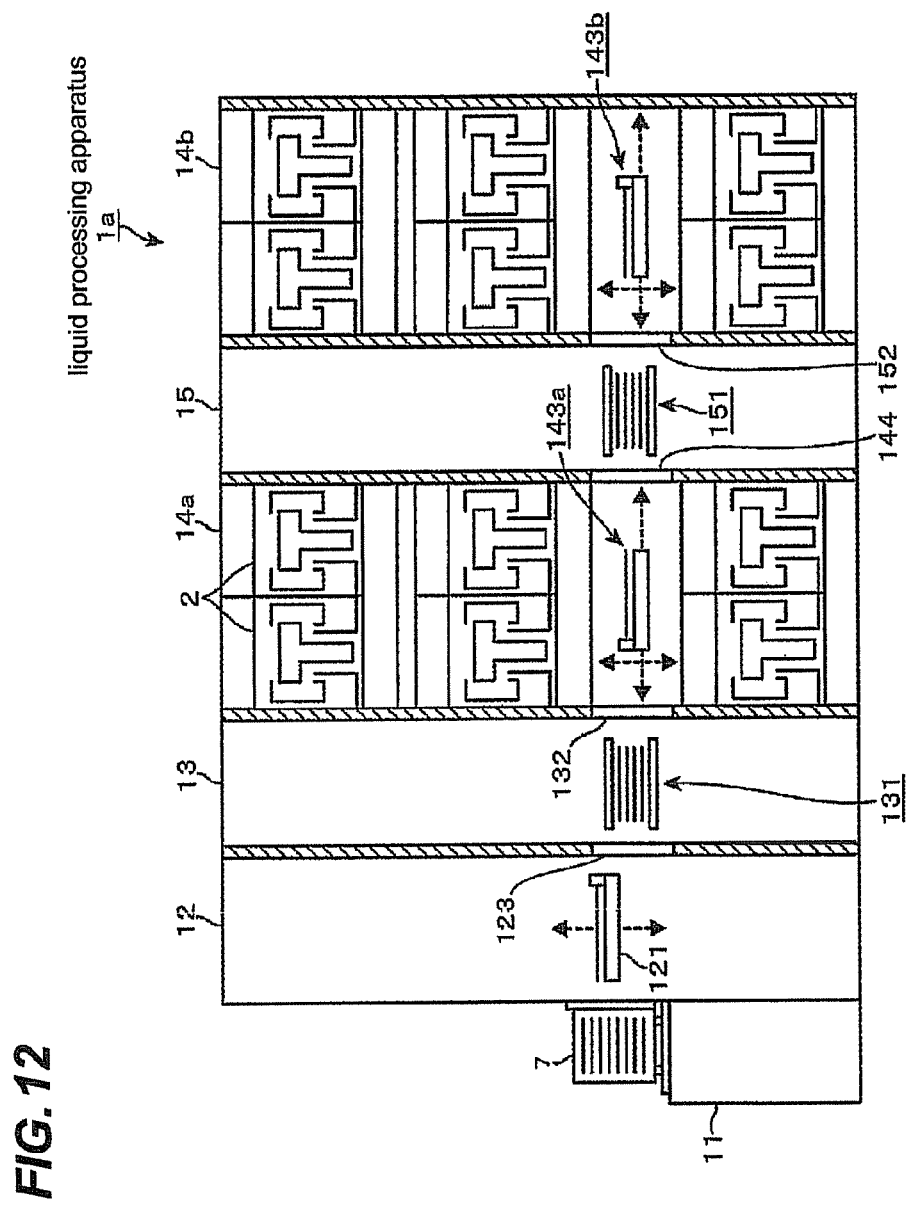
FIG. 12 is a longitudinal sectional side view of the liquid processing apparatus according to the second embodiment.
Figure 13:
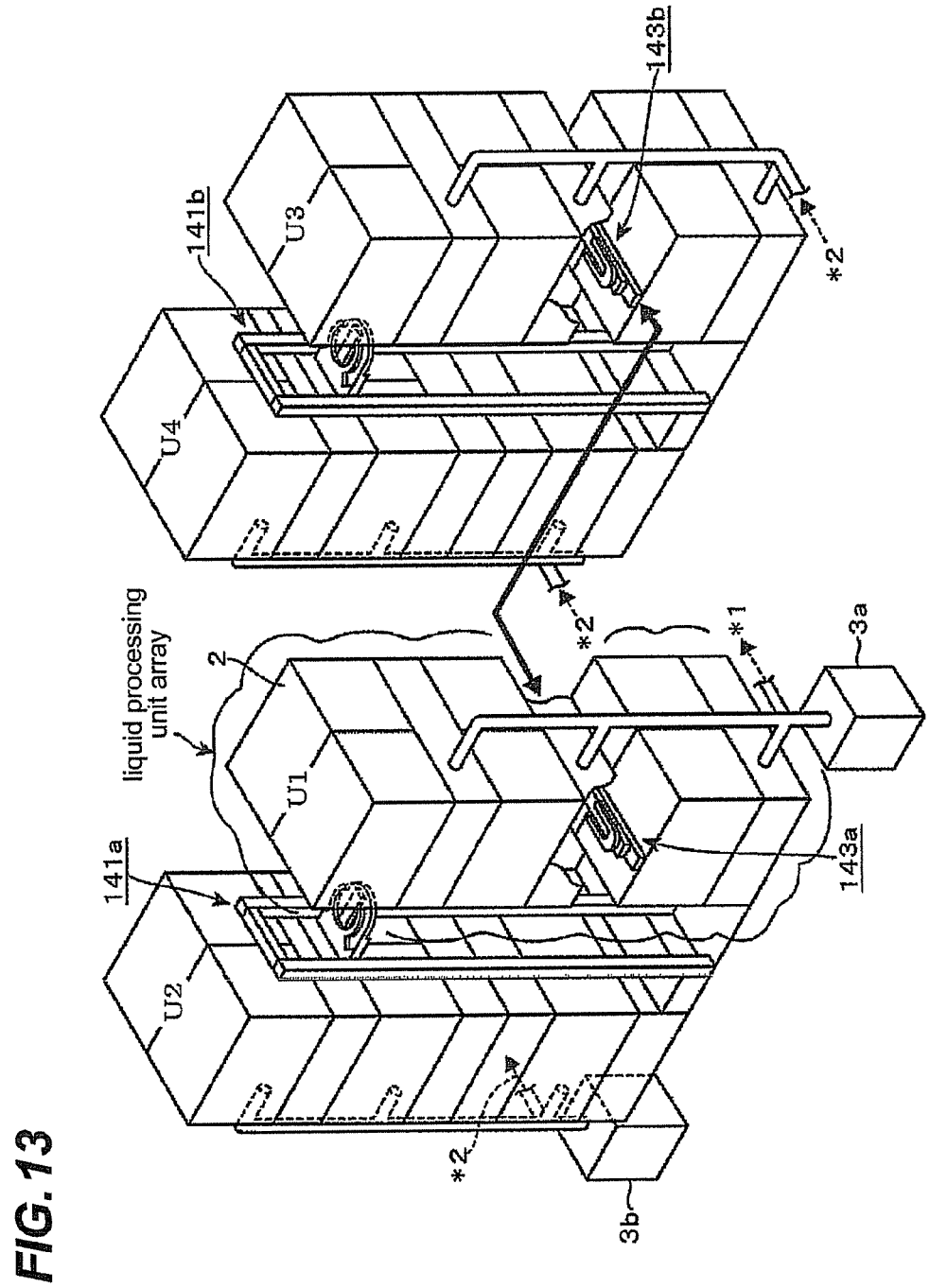
FIG. 13 is a perspective view illustrating the internal configuration of the liquid processing apparatus according to the second embodiment.

FIGS. 11 to 13 show a configuration of a liquid processing apparatus 1a according to a second embodiment. Liquid processing apparatus 1a according to the second embodiment is different from liquid processing apparatus 1 described above having two liquid processing blocks 14a, 14b stacked vertically, in that two liquid processing blocks 14a, 14b in the rear stage of transfer block 13 are disposed in the front/rear direction. In other words, liquid processing block 14b (the second processing block) is provided on the opposite side to transfer block 13 (the substrate introduction block) with respect to liquid processing block 14a (the first processing block). In liquid processing apparatus 1a shown in FIGS. 11 to 13, the same components as those in liquid processing apparatus 1 shown in FIGS. 1 to 3 are designated with the same reference numerals.

Each liquid processing block 14a, 14b is provided with liquid processing unit arrays U1~U4 on the right and left sides of a central conveying path 142a, 142b when viewed from the front, and six liquid processing units 2 are arranged in each liquid processing unit array U1~U4 in two rows in the front/rear directions and three stages in the vertical direction. Accordingly, in liquid processing apparatus 1a of the present embodiment, twelve liquid processing units 2 are arranged in liquid processing block 14a of the front stage side and twelve liquid processing units 2 are arranged in liquid processing block 14b of the rear stage side, so the total number of liquid processing unit 2 is 24.

Also, in liquid processing block 14a of the front stage side, common process arm 141a carries-in/carries-out wafer W with respect to liquid processing unit 2 included in a first liquid processing unit array U1 consisted of six liquid processing units 2 that are stacked in two rows in the front/back direction and three stages in the vertical direction on the right side of conveying path 142a when viewed from the front and liquid processing unit 2 included in a second liquid processing unit array U2 having six liquid processing units 2 that are stacked on the left side of conveying path 142a in the same manner as first liquid processing unit array U1. Also, in liquid processing block 14b of the rear stage side, the common process arm 141b carries-in/carries-out wafer W with respect to liquid processing unit 2 included in a third liquid processing unit array U3 having six liquid processing units 2 that are stacked on the right side of conveying path 142b when viewed from the front and liquid processing unit 2 included in a fourth liquid processing unit array U2 having six liquid processing units 2 that are stacked on the left side of conveying path 142b.

In this regard, referring to the chemical liquid supplying units 3a, 3b, as shown in FIG. 13, first liquid processing unit array U1 provided on the right side of conveying path 142a (process arm 141a) in liquid processing block 14a of the front stage, when viewed from the front, and third liquid processing unit array U3 provided on the right side of conveying path 142b (or process arm 141b) when viewed from the front in liquid processing block 14b of the rear stage, are connected with common chemical liquid supplying unit 3a. Meanwhile, second liquid processing unit array U2 provided on the left side of conveying path 142a in liquid processing block 14a of the front stage and the fourth liquid processing unit array U4 provided on the left side of conveying path 142b in liquid processing block 14b of the rear stage, are connected with common chemical liquid supplying unit 3b.

In liquid processing apparatus 1a, transfer block 13 has one transfer shelf 131, and all of wafers W conveyed between conveying block 12 and liquid processing block 14a, 14b are placed on transfer shelf 131. Also, a transfer block 15 is provided between liquid processing block 14a of the front stage and liquid processing block 14b of the rear stage, and wafer W is transferred between the front stage and the rear stage through a transfer shelf 151 as a substrate placement portion provided in transfer block 15. Also, transfer block 15 is not shown in FIGS. 13 to 16.

In liquid processing block 14a of the front stage, a shuttle arm 143a as a first interblock conveying device is provided between liquid processing unit 2 in the first stage and liquid processing unit 2 in the second stage of liquid processing unit array U1 on the right side, for example, when viewed from the front. And the first interblock conveying device is configured to convey wafer W within a space provided between the first stage and the second stage, and to transfer wafer W among transfer shelf 131, process arm 141a provided in liquid processing block 14a of the front stage, and transfer shelf 151.

Meanwhile, in liquid processing block 14b of the rear stage, a shuttle arm 143b as a second interblock conveying device is provided between liquid processing unit 2 in the first stage and liquid processing unit 2 in the second stage of liquid processing unit array U3 on the right side, for example, when viewed from the front. And the first interblock conveying device is configured to convey wafer W within a space provided between the first stage and the second stage, and to transfer wafer W between transfer shelf 151 and process arm 141b provided in liquid processing block 14b of the rear stage.

By incorporating the above configuration, wafer W placed on transfer shelf 131 in order to perform a liquid processing in liquid processing unit 2 within liquid processing block 14a of the front stage, is transferred from shuttle arm 143a→process arm 141a in this order, and then is carried into each liquid processing unit 2. Meanwhile, wafer W placed on transfer shelf 131 in order to perform a liquid processing in liquid processing unit 2 within liquid processing block 14b of the rear stage, is transferred from shuttle arm 143a→transfer arm 151→shuttle arm 143b→process arm 141b in this order, and then is carried into each liquid processing unit 2.

Figure 14:
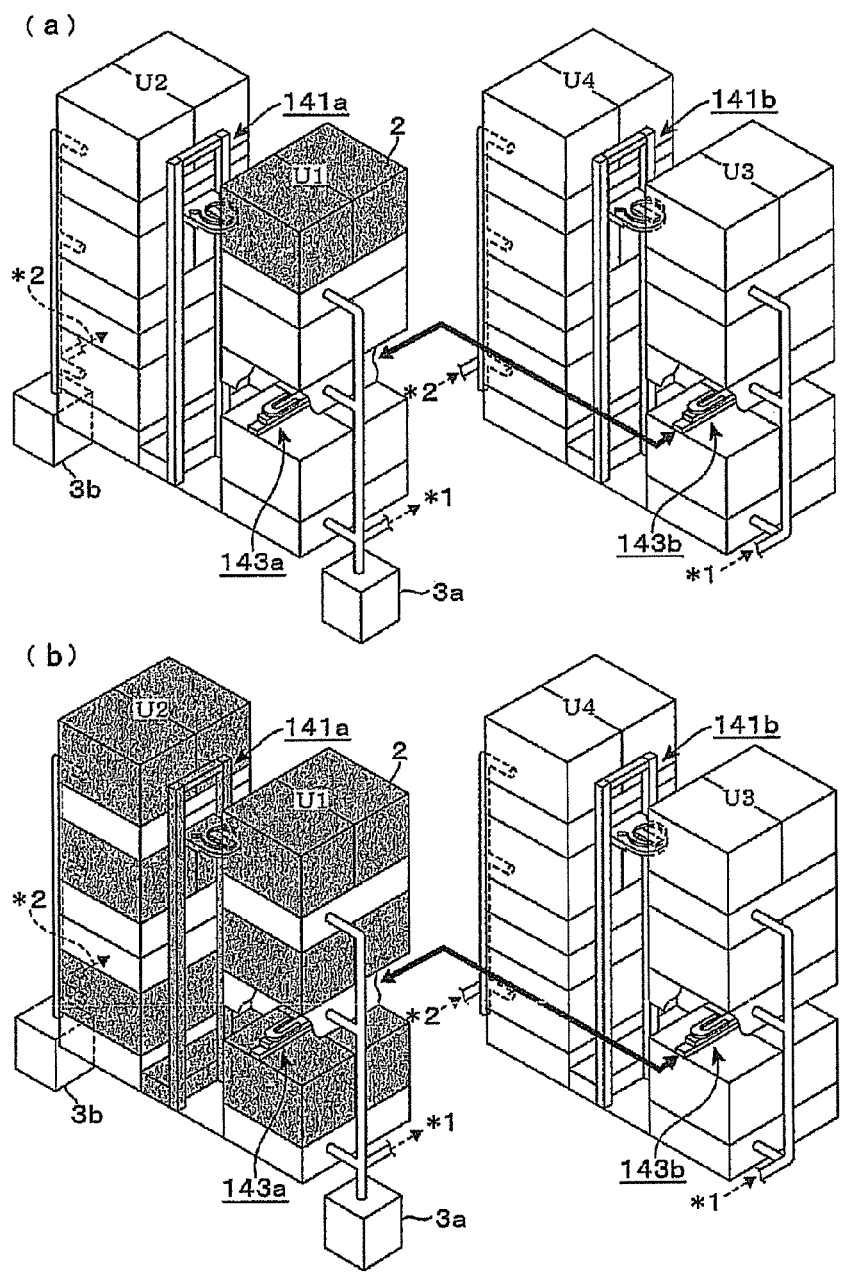
FIG. 14 is a first explanatory view illustrating the operation of the liquid processing apparatus according to the second embodiment.

Now, the operating state according to the trouble occurred at each component 2, 3a, 3b, 141a, 141b, 143a, 143b, 121 of liquid processing apparatus 1a with the above configuration will be described. FIG. 14 (*a*) shows the operating state, for example, when liquid processing unit 2 provided in the uppermost stage of liquid processing unit array U1 has a trouble. In a case that an access door for maintenance is provided in every stage of liquid processing block 14a, 14b as described above, it is not necessary to stop liquid processing unit array U1 entirely. In this example, in liquid processing unit array U1 including liquid processing unit 2 having a trouble, only liquid processing unit 2 of the stage sharing the access door is to be stopped.

When a trouble occurs in process arm 141a, 141b, this process arm 141a, 142b is to be stopped along with liquid processing unit arrays U1, U2 (or U3, U4) provided on the right and left sides thereof. FIG. 14 (b) shows the operating state, when process arm 141a of the front stage side has a trouble.

When a trouble occurs in chemical liquid supplying unit 3a, 3b, this chemical liquid supplying unit 3a, 3b is to be stopped along with liquid processing unit arrays U1, U3 (or U2, U4) connected thereto. FIG. 15 (a) shows the operating state, when chemical liquid supplying unit 3a on the right side as seen from the front has a trouble.

Next, when a trouble occurs at shuttle arm 143a provided in liquid processing block 14a of the front stage, wafer W cannot be transferred between process arm 141a of liquid processing block 14a and transfer shelf 151 of the rear stage. For this reason, all of liquid processing unit arrays U1~U4 are to be stopped as shown in FIG. 15 (b). Although not shown in the present embodiment, when carry-in/carry-out arm 121 is stopped, then all of liquid processing unit arrays U1~U4 are to be stopped.

Figure 16:
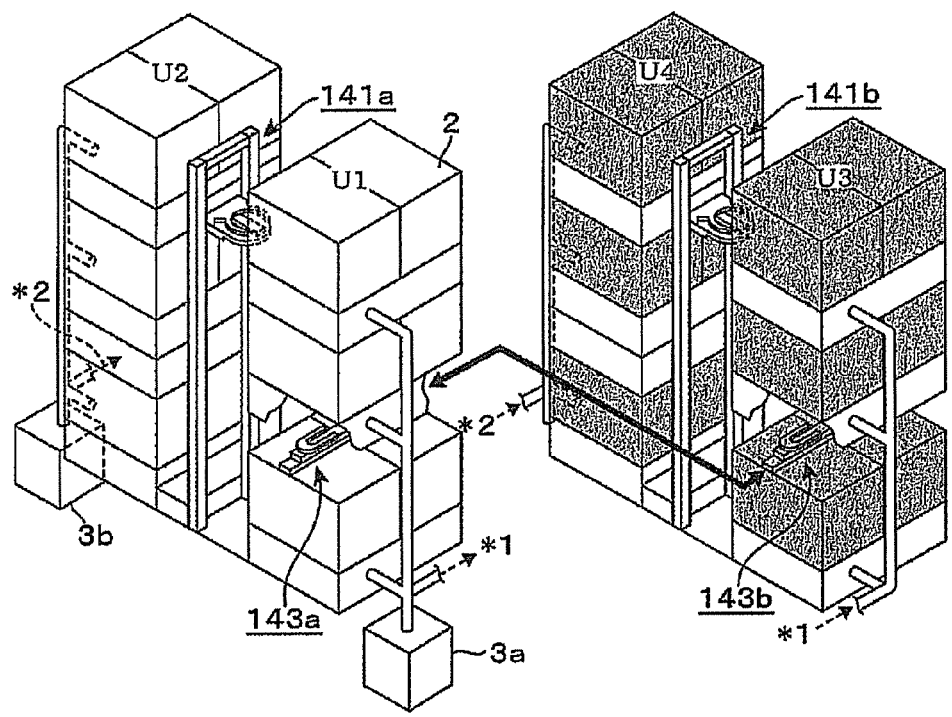
FIG. 16 is a third explanatory view illustrating the operation of the liquid processing apparatus according to the second embodiment.

Meanwhile, when a trouble occurs at shuttle arm 143b provided in liquid processing block 14b of the rear stage, wafer W simply cannot be transferred only between shuttle arm 143b and transfer shelf 151, but shuttle arm 143a of the front stage side can transfer wafer W to process arm 141a of liquid processing block 14a. Accordingly, only liquid processing unit arrays U3, U4 of liquid processing block 14b are to be stopped (FIG. 16).

Herein, the number of the stages of liquid processing blocks 14a, 14b stacked vertically as in liquid processing apparatus 1 according to the first embodiment, or the number of liquid processing blocks 14a, 14b arranged in a row in the front/rear directions as in liquid processing apparatus 1a according to the second embodiment, is not limited to the number indicated in these embodiments. For example, liquid processing blocks 14a, 14b may be provided in three or more stages, or in three or more rows, and liquid processing blocks 14a, 14b also may be provided by combination of arranging them in a row in the front/rear directions and stacking them in a vertical direction, such as 3 rows×3 stages.

Also, liquid processing blocks 14a, 14b including process arms 141a, 141b configured to convey wafer W in a transverse direction may be connected to each other in the front/rear directions, for example, via transfer block 15, as shown in liquid processing apparatus 1 of the first embodiment. Alternatively, liquid processing blocks 14a, 14b including process arms 141a, 141b configured to convey wafer W in the vertical direction may be stacked on the top of each other in the vertical direction, as shown in liquid processing apparatus 1a of the second embodiment. Further, if the layout of a factory allows, for example, liquid processing blocks 14a, 14b may be connected to transfer block 13 side by side in the left/right directions as seen from the front, and chemical liquid supplying units 3a, 3b may be shared among liquid processing unit arrays U1~U2 adjacent to each other.

Also, in each embodiment described above, when it is checked that a trouble occurs in each component 2, 3a, 3b, 141a, 141b, 143a, 143b, 121 to be monitored, liquid processing unit arrays U1~U4 chosen on the basis of the setup of group classification table 622 is to be stopped immediately. However, the stop timing is not limited to the above. For example, when a trouble occurs in single liquid processing unit 2, process arms 141a, 14ab, or carry-in/carry-out arm 121, then liquid processing unit 2 being able to continue processing is included in liquid processing unit array U1~U4 to be stopped. In this case, after the current running processing for wafer W is completed, if the condition that wafer W can be taken out is established, then liquid processing unit arrays U1~U4 chosen can be stopped.

Further, by incorporating a configuration accessible to first transfer shelf 133 and also through process arms 141a, 141b, for example, when a trouble occurs at carry-in/carry-out arm 121, liquid processing unit arrays U1~U4 may be stopped after the processing for wafer W in all of liquid processing unit arrays U1~U4 is completed, and then wafer W is taken out from each liquid processing unit 2 and accommodated in first transfer shelf 133.

In addition, it is not limited to the case that chemical liquid supplying units 3a, 3b are shared in liquid processing unit arrays U1 and U3, U2 and U4 located at the same side with respect to conveying paths 142a, 142b. For example, chemical liquid supplying units 3a, 3b may be shared in liquid processing unit arrays U1 and U4, U3 and U2 located at the opposite side across conveying paths 142a, 142b.

Also, in each embodiment described above, control unit 6 checks actively whether a trouble occurs in each component 2, 3a, 3b, 141a, 141b, 143a, 143b, 121, and then the supplying of electric power to liquid processing unit arrays U1~U4 chosen on the basis of group classification table 622 is to be shutout. However, it is not limited to the case that each of liquid processing unit arrays U1~U4 is to be stopped by actively shutting out the supplying of electric power as described above. For example, when either one of process arms 141a, 141b or carry-in/carry-out arm 121 has a trouble, each liquid processing unit 2 performs the processing for wafer W on the basis of a recipe, and at the time that a sequence cannot proceed further due to the stop of process arms 141a, 141b or carry-in/carry-out arm 121, liquid processing unit arrays U1~U4 indicated in group classification table 622 in FIG. 7 can be stopped consequently. When either one of chemical liquid supplying units 3a, 3b has a trouble, because the chemical liquid cannot be supplied, even when the electric power is not shutout, liquid processing unit arrays U1~U4 connected to chemical liquid supplying units 3a, 3b are to be stopped at the moment of trouble occurrence.

Also, the processing using a fluid is not limited to the above liquid processing, but can be applied to, for example, a processing apparatus for hydrophobic modification of the surface of wafer W by supplying wafer W with HMDS (Hexa-Methyl-Di-Silazane) vapor and the like.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus, comprising:
a substrate introduction block having a container placement portion configured to place a substrate storage container having substrates stored therein, and a transfer device configured to transfer the substrates with the substrate storage container placed on the container placement portion;
a first processing block placed adjacent to the substrate introduction block including a first processing unit array and a second processing unit array configured to process the substrates received from the substrate introduction block, the first processing block having a first substrate conveying device dedicated to convey the substrates in the first processing block along a straight conveying path, and each of the first processing unit array and the second processing unit array comprised of a plurality of processing units each configured to perform the same process with a processing liquid, where each of the first processing unit array and the second processing unit array is provided at both sides of the first substrate conveying device in a horizontal direction such that the substrates are conveyed to the plurality of processing units of the first processing unit array and the second processing unit array by the first substrate conveying device;

a second processing block placed adjacent to the first processing block including a third processing unit array and a fourth processing unit array configured to process the substrates received from the substrate introduction block, the second processing block having a second substrate conveying device dedicated to convey the substrates in the second processing block along a straight conveying path, and each of the third processing unit array and the fourth processing unit array comprised of a plurality of processing units each configured to perform the same process as the plurality of processing units of the first processing unit array and the second processing unit array of the first processing block, respectively, where each of the third processing unit array and the fourth processing unit array is provided at both sides of the second substrate conveying device in a horizontal direction such that the substrates are conveyed to the plurality of processing units of the third processing unit array and the fourth processing unit array by the second substrate conveying device;

a first processing fluid supply system commonly provided with respect to the first processing unit array of the first processing block and the third processing unit array of the second processing block;

a second processing fluid supply system installed separately from the first processing fluid supply system and commonly provided with respect to the second processing unit array of the first processing block and the fourth processing unit array of the second processing block; and a control unit programmed to process the substrates using the second processing block when the first substrate conveying device has a trouble, and to process the substrates using the first processing block when the second substrate conveying device has a trouble, wherein the control unit is further programmed to process the substrates using the second processing unit array of the first processing block and the fourth processing unit array of the second processing block when the first processing fluid supply system has a trouble, and to process the substrates using the first processing unit array of the first processing block and the third processing unit array of the second processing block when the second processing fluid supply system has a trouble, and the first processing fluid supply system has a plurality of compartments, each configured to hold a different processing fluid, and the second processing fluid supply system has the same number of compartments as does the first processing fluid supply system, and each of the compartments of the second processing fluid supply system being configured to hold the same processing fluids that are contained in the compartments of the first processing fluid supply system.

2. The substrate processing apparatus according to claim 1, wherein, when a trouble occurs at a processing unit, the control unit controls to stop using the processing unit array containing the processing unit and process the substrates by another processing unit array.

3. The substrate processing apparatus according to claim 1, wherein the first processing block and the second processing block are stacked on each other.

4. The substrate processing apparatus according to claim 1, wherein the second processing block is provided on the opposite side of the substrate introduction block with respect to the first processing block.

5. The substrate processing apparatus according to claim 4, comprising:
a substrate placement portion configured to transfer substrates between the first processing block and the second processing block;
a first interblock conveying device provided independently of the first conveying device, and configured to convey the substrates received from the substrate introduction block to the first processing block or the substrate placement portion; and
a second interblock conveying device provided independently of the second conveying device, and configured to convey the substrates placed on the substrate placement portion to the second processing block.

6. A substrate processing apparatus, comprising:
a substrate introduction block having a container placement portion configured to place a substrate storage container having substrates stored therein, and a transfer device configured to transfer the substrates with the substrate storage container placed on the container placement portion;
a first processing block placed adjacent to the substrate introduction block including a first processing unit array and a second processing unit array configured to process the substrates received from the substrate introduction block, the first processing block having a first substrate conveying device dedicated to convey the substrates in the first processing block along a straight conveying path, and each of the first processing unit array and the second processing unit array comprised of a plurality of processing units each configured to perform the same process with a processing liquid, where each of the first processing unit array and the second processing unit array is provided at both sides of the first substrate conveying device in a horizontal direction such that the substrates are conveyed to the plurality of processing units of the first processing unit array and the second processing unit array by the first substrate conveying device;
a second processing block placed adjacent to the first processing block including a third processing unit array and a fourth processing unit array configured to process the substrates received from the substrate introduction block, the second processing block having a second substrate conveying device dedicated to convey the substrates in the second processing block along a straight conveying path, and each of the third processing unit array and the fourth processing unit array comprised of a plurality of processing units each configured to perform the same process as the plurality of processing units of the first processing unit array and the second processing unit array of the first processing block, respectively, where each of the third processing unit array and the fourth processing unit array is provided at both sides of the second substrate conveying device in a horizontal direction such that the substrates are conveyed to the plurality of processing units of the third processing unit array and the fourth processing unit array by the second substrate conveying device;
a first processing fluid supply system commonly provided with respect to the first processing unit array of the first processing block and the third processing unit array of the second processing block;
a second processing fluid supply system installed separately from the first processing fluid supply system and commonly provided with respect to the second processing unit array of the first processing block and the fourth processing unit array of the second processing block; and
a control unit programmed to process the substrates using the second processing block when the first substrate conveying device has a trouble, and to process the substrates using the first processing block when the second substrate conveying device has a trouble,
wherein the control unit is further programmed to process the substrates using the second processing unit array of the first processing block and the fourth processing unit array of the second processing block when the first processing fluid supply system has a trouble, and to process the substrates using the first processing unit array of the first processing block and the third processing unit array of the second processing block when the second processing fluid supply system has a trouble, and the first processing fluid supply system has a plurality of compartments, each configured to hold a different processing fluid, and the second processing fluid supply system has the same number of compartments as does the first processing fluid supply system, and each of the compartments of the second processing fluid supply system being configured to hold the same processing fluids that are contained in the compartments of the first processing fluid supply system, and the second processing block is disposed adjacent to the substrate introduction block.

* * * * *